United States Patent
Darnell et al.

(10) Patent No.: US 9,880,242 B2
(45) Date of Patent: Jan. 30, 2018

(54) RF COIL ELEMENTS WITH SPLIT DC LOOPS FOR MAGNETIC RESONANCE IMAGING SYSTEMS FOR INTEGRATED PARALLEL RECEPTION, EXCITATION, AND SHIMMING AND RELATED METHODS AND DEVICES

(71) Applicant: Duke University, Durham, NC (US)

(72) Inventors: Dean Darnell, Durham, NC (US); Trong-Kha Truong, Durham, NC (US); Allen W. Song, Chapel Hill, NC (US)

(73) Assignee: Duke University, Durham, NC (US)

( * ) Notice: Subject to any disclaimer, the term of this patent is extended or adjusted under 35 U.S.C. 154(b) by 276 days.

(21) Appl. No.: 14/881,767

(22) Filed: Oct. 13, 2015

(65) Prior Publication Data

US 2016/0116556 A1   Apr. 28, 2016

Related U.S. Application Data

(60) Provisional application No. 62/067,193, filed on Oct. 22, 2014.

(51) Int. Cl.
G01R 33/3875 (2006.01)
G01R 33/3415 (2006.01)
G01R 33/565 (2006.01)

(52) U.S. Cl.
CPC ..... *G01R 33/3875* (2013.01); *G01R 33/3415* (2013.01); *G01R 33/5659* (2013.01)

(58) Field of Classification Search
USPC .......................... 324/300–322; 600/407–435; 382/128–131
See application file for complete search history.

(56) References Cited

U.S. PATENT DOCUMENTS 7,598,739 B2   10/2009   Vaughan, Jr. et al.
7,800,368 B2    9/2010   Vaughan et al.
(Continued)

FOREIGN PATENT DOCUMENTS

WO   WO 2014/003918 A1   1/2014

OTHER PUBLICATIONS

Bernstein et al. "Imaging Artifacts at 3.0T", *Journal of Magnetic Resonance Imaging*, 24:735-746, 2006.
(Continued)

*Primary Examiner* — Melissa Koval
*Assistant Examiner* — Tiffany Fetzner
(74) *Attorney, Agent, or Firm* — Myers Bigel, P.A.

(57) ABSTRACT

Systems, methods and devices are configured for integrated parallel reception, excitation, and shimming (iPRES) with RF coil elements with split DC loops. Parallel transmit/receive (which can include $B_1$ shimming and/or parallel imaging capabilities) and $B_0$ shimming employ the same set of localized coils or transverse electromagnetic (TEM) coil elements, with each coil or TEM element working in both an RF mode (for transmit/receive and $B_1$ shimming) and a direct current (DC) mode (for $B_0$ shimming) simultaneously. Both an RF and a DC current (in split DC loops) can flow in the same coil element simultaneously but independently with no electromagnetic interference between the two modes.

25 Claims, 15 Drawing Sheets
(8 of 15 Drawing Sheet(s) Filed in Color)

(56) References Cited

U.S. PATENT DOCUMENTS

| | | | |
|---|---|---|---|
| 2014/0002084 A1* | 1/2014 | Han | G01R 33/3628 324/322 |
| 2015/0177344 A1* | 6/2015 | Han | G01R 33/3628 324/322 |
| 2016/0116556 A1* | 4/2016 | Darnell | G01R 33/3875 324/307 |

OTHER PUBLICATIONS

Blamire, "The Technology of MRI—The next 10 years?", *The British Journal of Radiology*, 81, 2008, 601-617.

de Graff et al. "Dynamic Shim Updating (DSU) for Multislice Signal Acquisition", *Magn Reson Med*, 49:409-416, 2003.

Golay, "Field Homogenizing Coils for Nuclear Spin Resonance Instrumentation", *Review of Scientific Instruments*, 29, 313, 1958.

Graessl et al. "Design, evaluation and application of a modular 32 channel transmit/receive surface coil array for cardiac MRI at 7T", *Proceedings of the ISMRM 20$^{th}$ Annual Meeting*, Melbourne, 2012, p. 305.

Han et al. Integrated parallel reception, excitation, and shimming (iPRES), Magn Resonance in Medicine, 70(1), 241-247 (2013).

Harris et al. "A new approach to shimming: the dynamically controlled adaptive current network" Magnetic Resonance in Medicine, 71(2), 859-869 (2014).

Juchem et al. "Dynamic Multi-Coil Shimming of the Human Brain at 7 Tesla", *J Magn Reson*. 212(2): 280-288, Oct. 2011.

Juchem et al. "Magnetic Field Modeling with a Set of Individual Localized Coils", *J Magn Reson.*, Jun. 2010; 204(2):281-289.

Juchem et al. "Multicoil Shimming of the Mouse Brain", *Magn Reson Med*, 66:893-900, 2011.

Koch et al. "Optimization of static magnetic field homogeneity in the human and animal brain in vivo", *Prog Nucl Magn Reson Spectrosc.*, Feb. 1, 2009; 54(2): 69-96.

Kraff et al. "An eight-channel transmit/receive multipurpose coil for musculoskeletal MR imaging at 7 T", *Med Phys.*, Dec. 2010:37(12):6368-76.

Romeo et al. "Magnet field profiling: analysis and correcting coil design", *Magn Reson Med.*, Mar. 1984:1(1):44-65.

Setsompop et al. "Parallel RF Transmission With Eight Channels at 3 Tesla", *Magn Reson Med.*, 56:1163-1171, 2006.

Truong et al. "Integrated RF/shim coil array for parallel reception and localized B$_0$ shimming in the human brain at 3T", Proceedings of the 22$^{nd}$ Annual Meeting of the International Society for Magnetic Resonance in Medicine, Milan, Italy, p. 4849, Published Apr. 25, 2014.

Truong TK et al. "Integrated RF/shim coil array for parallel reception and localized B0 shimming in the human brain" NeuroImage, 103: 235-240 (2014).

Vaughan et al. "9.4T Human MRI: Preliminary Results", *Magn Reson Med.*, 56:1274-1282, 2006.

Wiggins et al. "32-Channel 3 Tesla Receive-Only Phased-Array Head Coil With Soccer-Ball Element Geometry", *Magn Reson Med.*, 56:216-223, 2006.

Wilson et al. "Optimization of Static Field Homogeneity in Human Brain Using Diamagnetic Passive Shims", *Magn Reson Med.*, 48:906-914, 2002.

\* cited by examiner

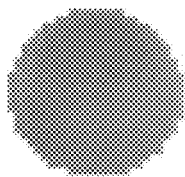 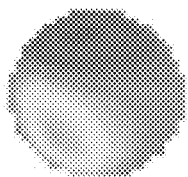 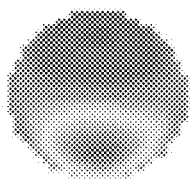 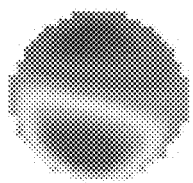 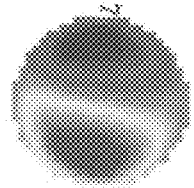
FIG. 7A    FIG. 7B    FIG. 7C    FIG. 7D    FIG. 7E
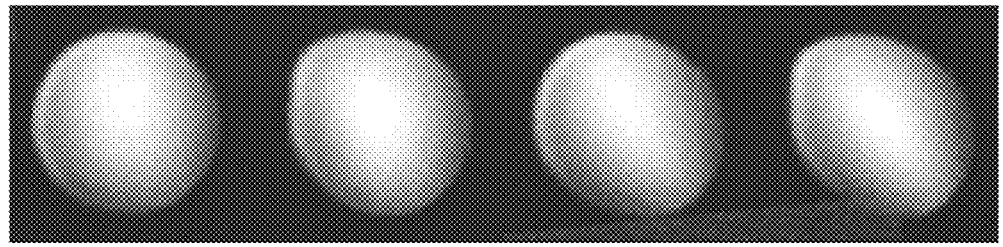
FIG. 8A    FIG. 8B    FIG. 8C    FIG. 8D
FIGURE 9. EPI IMAGES.
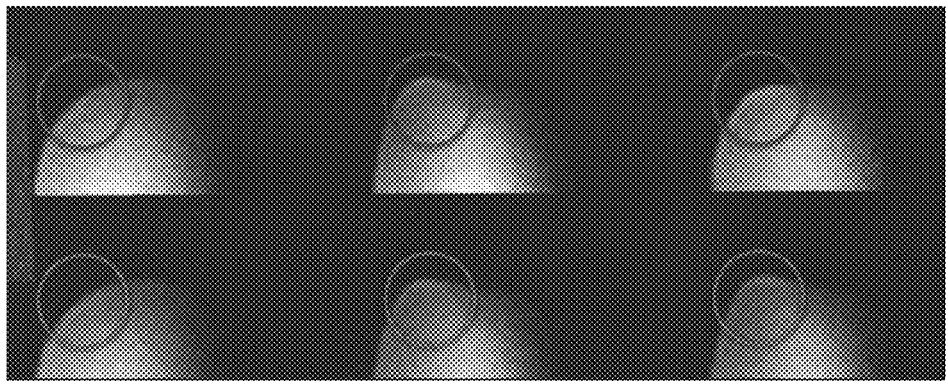
FIG. 9A
FIG. 9B
WHEN THE PERTURBATION IS APPLIED, THE EPI IMAGES ACQUIRED WITH EITHER COIL ARE STRETCHED ON THE LEFT AND COMPRESSED ON THE RIGHT BECAUSE OF THE ASYMMETRICAL $B_0$ INHOMOGENEITIES INTRODUCED BY THE OPPOSITE DC CURRENTS APPLIED IN THE TWO PERTURBATION LOOPS (FIG. 9, TOP AND BOTTOM, MIDDLE).

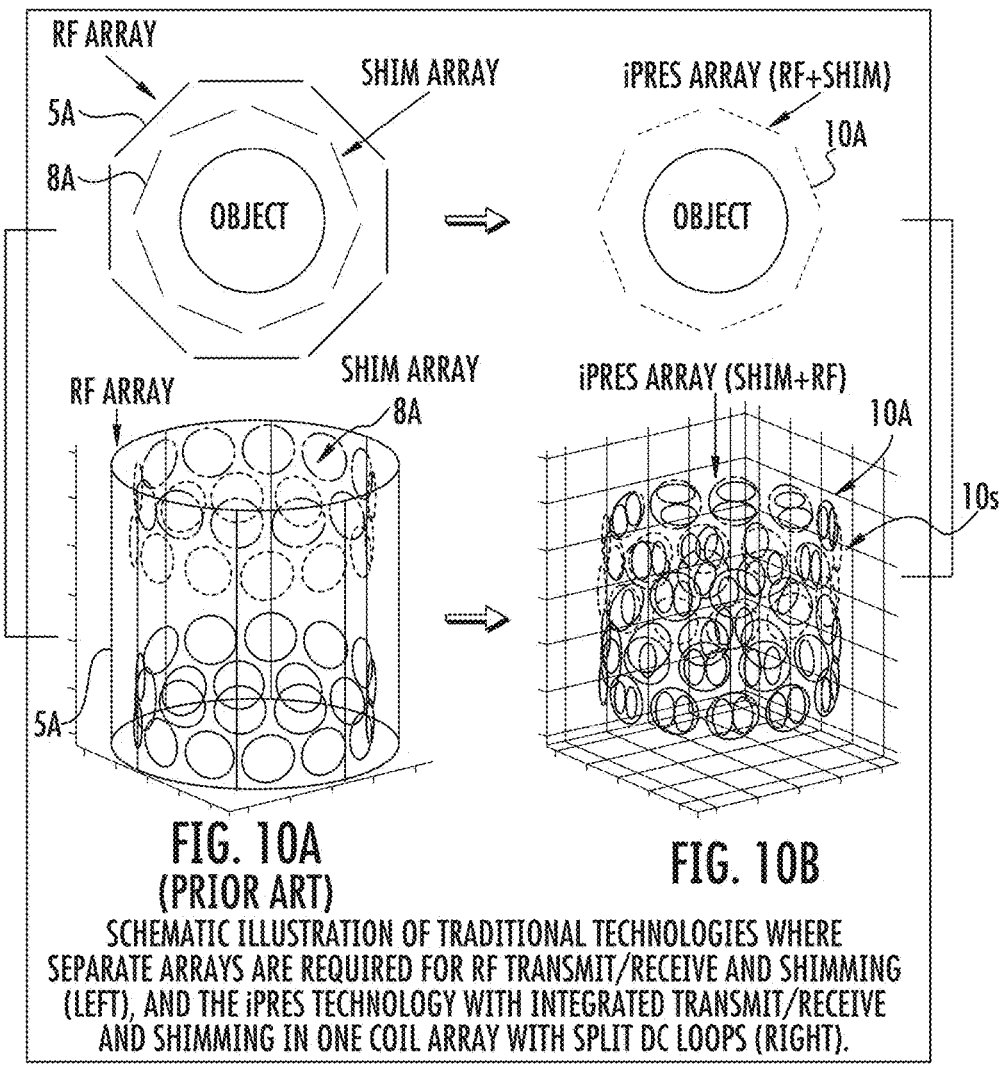
FIG. 10A (PRIOR ART)
FIG. 10B
SCHEMATIC ILLUSTRATION OF TRADITIONAL TECHNOLOGIES WHERE SEPARATE ARRAYS ARE REQUIRED FOR RF TRANSMIT/RECEIVE AND SHIMMING (LEFT), AND THE iPRES TECHNOLOGY WITH INTEGRATED TRANSMIT/RECEIVE AND SHIMMING IN ONE COIL ARRAY WITH SPLIT DC LOOPS (RIGHT).
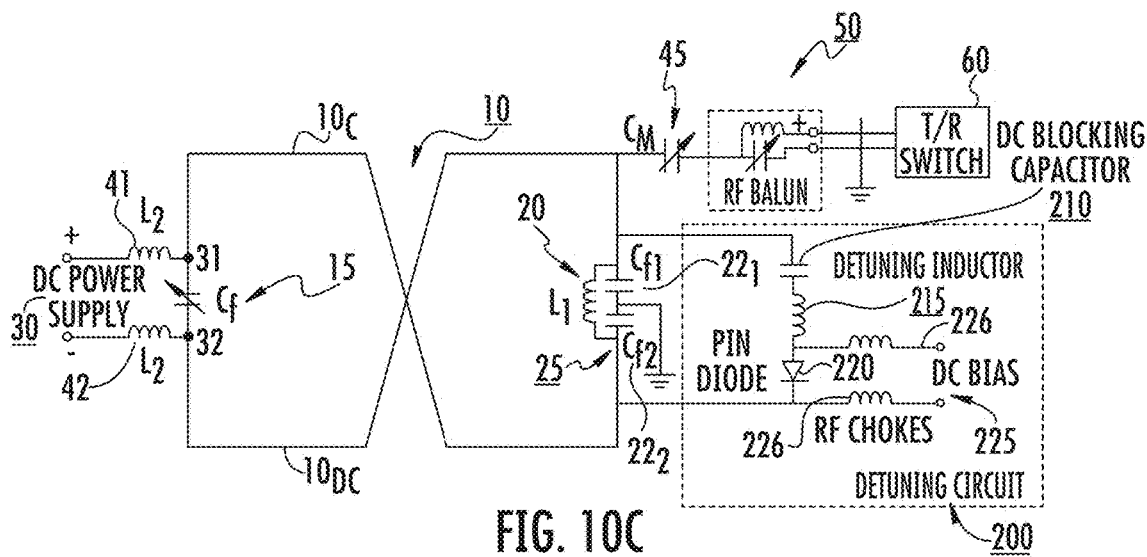
FIG. 10C

RF COIL ELEMENTS WITH SPLIT DC LOOPS FOR MAGNETIC RESONANCE IMAGING SYSTEMS FOR INTEGRATED PARALLEL RECEPTION, EXCITATION, AND SHIMMING AND RELATED METHODS AND DEVICES

RELATED APPLICATIONS

This application claims the benefit of and priority to U.S. Provisional Application Ser. No. 62/067,193, filed Oct. 22, 2014, the contents of which are hereby incorporated by reference as if recited in full herein.

FIELD OF THE INVENTION

This invention relates to Magnetic Resonance Imaging.

BACKGROUND

Major developments in magnetic resonance imaging (MRI) technology have been driven by the ever increasing demand for higher static magnetic field ($B_0$) strengths. This increase, however, has posed many technical challenges, most notably the exacerbated inhomogeneity in both the main magnetic field ($B_0$) and the radiofrequency (RF) magnetic field ($B_1$). See, e.g., Blamire A M. The technology of MRI—the next 10 years? Brit J Radiol 2008; 81: 601-617; and Bernstein M A, Huston J, Ward H A. Imaging artifacts at 3.0 T. J Magn Reson Imaging 2006; 24:735-746.

A homogeneous $B_1$ field can be required to ensure a uniform excitation across the sample. Recent advances in parallel excitation (also known as parallel transmit) technology have provided an effective means to address this issue by using a process termed "RF" or "$B_1$" shimming, in which the amplitude, phase, timing, and frequency of the RF current in each coil element are independently adjusted. See, e.g., Vaughan T, DelaBarre L, Snyder C, Tian J F, Akgun C, Shrivastava D, et al. 9.4 T human MRI: preliminary results. Magn Reson Med 2006; 56:1274-1282; and Setsompop K, Wald L L, Alagappan V, Gagoski B, Hebrank F, Fontius U, Schmitt F, Adalsteinsson E. Parallel RF transmission with eight channels at 3 Tesla. Magn Reson Med 2006; 56:1163-1171. See also, U.S. Pat. Nos. 7,598,739 and 7,800,368, the contents of which are hereby incorporated by reference as if recited in full herein.

A homogeneous $B_0$ field is required to ensure a correct spatial representation of the imaged object. Homogenization of the magnetic field distribution (i.e., $B_0$ shimming) is often a difficult task when strong localized $B_0$ inhomogeneities are present. See, e.g., Koch K M, Rothman D L, de Graaf R A. Optimization of static magnetic field homogeneity in the human and animal brain in vivo. Prog Nucl Magn Reson Spectrosc 2009; 54:69-96.

Passive shimming, which relies on the optimal arrangement of magnetized materials, is limited by the often tedious work required and the lack of flexibility in subject-specific conditions. See, Wilson J L, Jenkinson M, Jezzard P. Optimization of static field homogeneity in human brain using diamagnetic passive shims. Magn Reson Med 2002; 48:906-914.

On the other hand, active shimming, which utilizes continuously adjustable electromagnets, is the most widely used shimming method and typically employs spherical harmonic (SH) coils, including the ability to provide dynamic shimming. See, Golay M J, Field homogenizing coils for nuclear spin resonance instrumentation. Rev Sci Instrum 1958; 29:313-315; and Romeo F, Hoult D I. Magnet field profiling: analysis and correcting coil design. Magn Reson Med 1984; 1:44-65. And de Graaf R A, Brown P B, McIntyre S, Rothman D L, Nixon T. Dynamic shim updating (DSU) for multislice signal acquisition. Magn Reson Med 2003; 49:409-416. The contents of these documents are hereby incorporated by reference as if recited in full herein.

In practice, however, SH shimming often cannot effectively correct for high-order localized field distortions because the required number of coils increases dramatically with the SH order. See, Golay M J, Field homogenizing coils for nuclear spin resonance instrumentation, Rev Sci Instrum 1958; 29:313-315. As such, it is typically limited to the second or third order.

Recently, Juchem et al. have proposed a multi-coil modeling and shimming method, in which a large number of small localized electrical coils are used to shape the $B_0$ field by independently adjusting the direct current (DC) in each coil, thus achieving an improved performance relative to SH shimming. However, it requires a separate set of shim coils adjacent to the RF coil array, which takes a considerable space within the constricted space between the subject and the magnet bore. In addition, when the shim coil array is placed within the RF coil array, a large gap needs to be kept open in the middle of the shim coil array to allow RF penetration and reduce the electromagnetic interference between the RF and shim coil arrays (i.e., RF damping), which reduces the flexibility and performance of the shimming. See, e.g., Juchem C, Nixon T W, McIntyre S, Rothman D L, de Graaf R A. Magnetic field modeling with a set of individual localized coils. J Magn Reson 2010 ; 204:281-289; Juchem C, Brown P B, Nixon T W, McIntyre S, Rothman D L, de Graaf R A. Multi-coil shimming of the mouse brain. Magn Reson Med 2011; 66:893-900; and Juchem C, Brown P B, Nixon T W, McIntyre S, Boer V O, Rothman D L, de Graaf R A. Dynamic multi-coil shimming of the human brain at 7 T. J Magn Reson 2011; 212:280-288. The contents of these documents are hereby incorporated by reference as if recited in full herein.

SUMMARY OF EMBODIMENTS THE INVENTION

Embodiments of the invention are directed to integrated parallel reception, excitation, and shimming (iPRES). See, e.g., co-pending U.S. patent application Ser. No. 13/898,993 and PCT Patent Application PCT/US2013/042020, the contents of which are hereby incorporated by reference as if recited in full herein. See also, Truong T K, Darnell D, Song A W (2014). Integrated RF/shim coil array for parallel reception and localized B0 shimming in the human brain. NeuroImage 103: 235-240, the content of which is also hereby incorporated by reference as if recited in full herein. This technique uses a new coil design that allows an RF current and a direct current (DC) to flow in the same coil or coil element simultaneously, thereby allowing parallel RF excitation/reception and localized $B_0$ shimming with a single coil array. Such an integrated RF/shim coil array can be placed close to the subject to maximize both the signal-to-noise ratio and shimming performance. Numerical simulations as well as phantom and human brain experiments have shown that this new technique can provide a more effective $B_0$ shimming than conventional spherical harmonic shimming. See, e.g., Han et al., Integrated parallel reception, excitation, and shimming (iPRES), Magnetic Resonance in Medicine. 70(1), 241-247 (2013); and Truong et al., Integrated RF/shim coil array for parallel reception and localized $B_0$ shimming in the human brain at 3 T. Proceedings of the 22'" Annual Meeting of the International Society for Magnetic Resonance in Medicine, Milan, Italy, p. 4849 (2014). The contents of which are also incorporated by reference as if recited in full herein.

Embodiments of the invention provide split DC loops for RF coil elements thereby allowing multiple smaller DC loops within each RF coil element, removing geometric dependence on size and shape of a respective RF coil element.

A Magnetic Resonance Imaging (MRI) system that includes an RF coil array with a plurality of coil elements, with respective coil elements having split DC loops and configured to be simultaneously operative in both (i) an RF mode for at least one of transmit or receive and (ii) a direct current (DC) mode with DC current flow in the respective coil elements to generate local $B_0$ magnetic fields. The system can also include at least one DC power supply in communication with the RF coil array to supply DC current to the coil elements and a circuit in communication with the RF coil array configured to direct the DC power supply to supply the DC current to the coil elements to generate the local $B_0$ magnetic fields.

The circuit can be configured to carry out $B_0$ shimming using the generated local $B_0$ magnetic fields.

The respective coil elements can include multiple DC loops (e.g., 2-24, depending on space constraints of a particular RF coil element size/shape)or more closed paths for each respective coil element for circulating DC current.

The closed paths can include at least one inductor associated with at least one parallel inductor capacitor (LC) resonant circuit with a high resonant frequency, wherein DC current flows through the at least one inductor of the at least one LC resonant circuit.

The RF coil array can be a transmit RF coil array or a transmit and receive RF coil array. When DC current flows through the at least one inductor of the at least one LC resonant circuit, RF signal can travel (primarily or solely) across a corresponding capacitor of the at least one LC resonant circuit.

The RF coil array can be a receive RF coil array. The system can include a cooperating transmit RF coil array.

The transmit RF coil array can be configured to also provide $B_1$ shimming in which the circuit is configured to independently adjust amplitude, phase, timing, and frequency of RF current in each coil element.

The RF coil array can be a receive only RF coil array. The system can include a cooperating transmit RF coil array.

The transmit RF coil array can also have a plurality of coil elements. The transmit RF coil array can include respective coil elements that have split DC loops and that can be simultaneously operative in both (i) an RF mode for transmit and (ii) a direct current (DC) mode with DC current flow in the respective coil elements to generate local $B_0$ magnetic fields for $B_0$ shimming to thereby allow independent and concurrent RF current and DC current flow in a respective coil element.

The circuit can be configured to concurrently generate the local Bo magnetic fields for $B_0$ shimming using at least some of the coil elements from both the transmit and receive RF coil arrays.

Coil elements from both the transmit and receive RF coil arrays may be configured to circulate DC current flow in the respective coil elements to generate the local $B_0$ magnetic fields (which may be used for $B_0$ shimming).

The system can include an active detuning circuit with a DC blocking capacitor for the RF coil array. The RF coil array can be a receive only RF coil array or a transmit/receive RF coil array.

The circuit can be in communication with or partially or totally onboard an MR Scanner. The coil elements can each include at least one loop for DC current from the DC power supply. The at least one loop can include at least one inductor from at least one parallel inductor capacitor (LC) resonant circuit with a high resonant frequency corresponding to an operating frequency of the MR Scanner.

In transmit operation, DC current can flow through the inductor of the LC resonant circuit while RF current flows across the capacitor of the LC resonant circuit.

The system can include an MR Scanner in communication with the RF coil array, and a transmit/receive switch in communication with the MR Scanner and the RF coil array. Respective coil elements of the RF coil array can include at least one LC resonant circuit.

The circuit can be in communication with or partially or totally onboard an MR Scanner.

The circuit can be configured to generate $B_0$ maps associated with the generated local $B_0$ magnetic fields and perform $B_0$ shimming.

The circuit can be configured to control DC current in the coil elements of the RF coil array and measure the generated local $B_0$ magnetic fields.

The RF coil array can be a single transmit and receive RF coil array. The circuit can be in communication with or partially or totally onboard an MR Scanner to cause the RF coil array to transmit and receive while shimming main field $B_0$ inhomogeneity using the generated local $B_0$ magnetic fields from the RF coil array.

The coil elements of the RF coil array can be configured to operate independently and simultaneously to transmit/receive RF signal and to generate the local $B_0$ magnetic fields for the $B_0$ magnetic field shimming.

The RF coil array can be configured to generate the local $B_0$ magnetic fields to provide a uniform magnetic field across biological tissue or target material.

Still other embodiments are directed to methods of shimming Magnetic Resonance (MR) systems. The methods include: (a) providing at least one RF coil with a plurality of coil elements, the coil elements having associated circuits with a direct current (DC) current path comprising split DC loops; (b) operating the at least one RF coil in at least one of an RF transmit or receive mode; (c) flowing DC current through the split DC current loops of the coil elements concurrently with the transmit or receive mode; and (d) generating local $B_0$ magnetic fields in response to the flow of the DC current through the split DC current loops of the coil elements, thereby $B_0$ shimming an imaging space of a magnet of the MR system using the generated local $B_0$ magnetic fields.

The operating the at least one RF coil can be carried out to operate in the RF transmit mode. The method can include concurrently flowing RF current through the coil elements to transmit an RF excitation pulse in the RF transmit mode while the DC current flows simultaneously and independently in the split loops of the coil elements without electromagnetic interference between the DC current and the RF current.

The method can include generating RF $B_1$ magnetic fields using the coil elements.

The method can include automatically performing $B_1$ shimming and $B_0$ shimming using the generated $B_1$ and $B_0$— magnetic fields, respectively.

The operating the at least one RF coil can be carried out by transmitting and receiving RF signal in parallel from the coil elements and automatically $B_0$ shimming using the generated local $B_0$ magnetic fields.

The at least one RF coil can be a single RF coil array.

The at least one RF coil can include first and second cooperating RF coil arrays.

The at least one RF coil has between about 1-512 RF coil elements.

The method can include electronically individually controlling DC current in each of the coil elements.

The providing the at least one RF coil can be carried out by providing a transmit RF coil array and a cooperating receive RF coil array. Transmit and receive RF coil arrays can each concurrently flow the DC current through respective coil elements to generate local $B_0$ magnetic fields. The method can include $B_0$ shimming for main magnetic field $B_0$ homogeneity using the generated local $B_0$ magnetic fields from both the transmit and receive RF coil arrays.

The providing the at least one RF coil can be carried out by providing a transmit only RF coil array and a cooperating receive only RF coil array. Only one of the transmit and receive RF coil arrays can be configured to flow the DC current through respective coil elements to generate local $B_0$ magnetic fields. The method can include automatically shimming for main magnetic field $B_0$ homogeneity using the generated local $B_0$ magnetic fields.

The providing the at least one RF coil can be carried out by providing a transmit RF coil array and a cooperating receive RF coil array. The receive only RF coil array can flow the DC current through respective coil elements to generate local $B_0$ magnetic fields. The method can include actively detuning the RF coil elements using a respective detuning circuit with a detuning inductor, an RF blocking capacitor and a PIN diode. The active detuning can be carried out by forward biasing the PIN diode so that RF current flows into the detuning circuit which detunes the coil element but DC current for $B_0$ shimming remains in the DC loop since it is isolated from the detuning circuit by the DC-blocking capacitor.

Yet other embodiments are directed to RF coil assemblies for an Magnetic Resonance Imaging (MRI) system. The RF coil assemblies include at least one RF coil array with a plurality of coil elements. A respective coil element includes a circuit with: (i) at least one DC current loop having a DC power supply connection with positive and negative terminals; (ii) at least one capacitor between the DC power supply connection terminals; (iii) optionally an RF choke residing in series between the positive and negative terminals of the DC power supply connection terminals and an associated DC power supply; and (iv) at least one parallel inductor capacitor (LC) resonant circuit component configured so that a respective coil element is a multi-tuned RF coil element having multiple resonant frequencies such that the coil element only operates at about an operating frequency of a target MR Scanner. In operation, DC current flows through a respective inductor of the at least one LC resonant circuit component and circulates in the at least one DC current loop to generate a local magnetic $B_0$ field. The RF coil assembly is configured to simultaneously provide both (i) an RF mode for at least one of transmit or receive and (ii) a direct current (DC) mode to generate local $B_0$ magnetic fields.

The generated local $B_0$ magnetic fields can be used for $B_0$ shimming.

The RF coil assemblies can include a control circuit configured to adjust DC current flow in the respective coil elements.

Each RF coil element can include a matching circuit that resides between the control circuit and a transmit/receive switch.

The RF coil assemblies can include first and second cooperating RF coil arrays with respective coil elements. The first array can be a receive (only) RF coil array and the second array can be a transmit (only) RF coil array. The respective coil elements of at least one of the transmit and receive RF coil arrays can be configured to flow DC current to generate the local $B_0$ magnetic fields (which may optionally be used for $B_0$ shimming).

Both the transmit and receive RF coil arrays can have the respective coil elements that are simultaneously operative in both (i) the RF mode and (ii) the direct current (DC) mode. The RF coil assembly can be adapted to connect to an MR Scanner configured to concurrently generate local $B_0$ magnetic fields using at least some of the coil elements from both the transmit and receive RF coil arrays.

The RF coil assembly can be a receive only and $B_0$ shim RF coil array. A respective coil element circuit comprises an active detuning circuit with a blocking capacitor.

Still other embodiments are directed to a circuit including at least one processor configured to individually control amplitude and/or direction of direct current (DC) current in respective current loops of coil elements of an RF coil array to adjust main magnetic field inhomogeneity of an MRI system for $B_0$ shimming.

Yet other embodiments are directed to computer program products that include a non-transitory computer readable storage medium having a computer readable program code embodied in the medium. The computer-readable program code including computer readable program code configured to control operation of an MRI imaging RF coil array with multiple coil elements with direct current (DC) loops so that the coil elements are simultaneously operative in both (i) an RF mode for at least one of RF transmit or RF receive and (ii) a DC mode where DC current flows in the DC loops to generate local $B_0$ magnetic fields for $B_0$ shimming; and computer readable program code configured to carry out $B_0$ shimming using the generated local $B_0$ magnetic fields.

The computer program product may include computer readable program code configured to individually control amplitude and/or direction of DC current in respective DC current loops.

Some embodiments of the present disclosure provide a new concept for integrated parallel reception, excitation, and shimming (iPRES). In some embodiments, methods, systems, and devices can be configured for parallel excitation (also known as parallel transmit) with $B_1$ shimming, parallel reception, and $B_0$ shimming employing the same set of localized coils/coil elements or transverse electromagnetic (TEM) coil elements (both inclusively referred to generally as "coil elements"), with each coil element working in both an RF mode (for transmit/receive) and a direct current (DC) mode (for $B_0$ shimming) simultaneously. Both RF signal can be transmitted/received and a DC current can flow in the same coil simultaneously but independently without electromagnetic interference between the two modes. The same coil array can be used for parallel transmit, receive and shim. Alternatively, two separate coil arrays can be used. The $B_0$ shimming capability can be integrated into each coil array (i.e. a transmit array with $B_1$ shimming capability, a receive array or both transmit and receive arrays), and some, typically all, coil elements from both arrays can be used together for $B_0$ shimming, resulting in a large number of degrees of freedom.

Embodiments of the invention contemplate that the DC mode of RF coils may be useful for spatial encoding.

It is noted that aspects of the invention described with respect to one embodiment, may be incorporated in a different embodiment although not specifically described relative thereto. That is, all embodiments and/or features of any embodiment can be combined in any way and/or combination. Further, any feature or sub-feature claimed with respect to one claim may be included in another future claim without reservation and such shall be deemed supported in the claims as filed. Thus, for example, any feature claimed with respect to a method claim can be alternatively claimed as part of a system, circuit, computer readable program code or workstation. Applicant reserves the right to change any originally filed claim or file any new claim accordingly, including the right to be able to amend any originally filed claim to depend from and/or incorporate any feature of any other claim although not originally claimed in that manner. These and other objects and/or aspects of the present invention are explained in detail in the specification set forth below.

The foregoing and other objects and aspects of the present invention are explained in detail herein.

BRIEF DESCRIPTION OF THE DRAWINGS

FIGS. 7A-7E are exemplary $B_0$ maps obtained with different currents applied in the split DC loops according to embodiments of the present invention.

FIGS. 8A-8D are images acquired using a spin-echo, echo-planar imaging (EPI) sequence with the same DC currents in counterpart respective $B_0$ maps shown in FIGS. 7A-7D according to embodiments of the present invention.

FIG. 9A is a set of EPI images acquired using a split coil element configuration (top row) according to embodiments of the present invention.

FIG. 9B is a set of EPI images acquired using a single DC loop RF coil element for comparison to the split coil element shown in FIG. 9A, according to embodiments of the present invention.

FIG. 10A is a schematic illustration of a prior art RF coil array and the $B_0$ shim array.

FIG. 10B is a schematic illustration of an example of an RF coil array with split DC loops according to embodiments of the present invention. In FIG. 10B, element 10A can mean three different cases. 1) 10A means a receive-only RF array integrated DC split loops with Bo shimming. 2) 10A means a transmit/receive RF array integrated DC split loops with Bo shimming. 3) 10A means a transmit-only RF array DC split loops integrated with Bo shimming.

FIG. 10C is a schematic illustration of an RF coil element circuit in communication with an active detuning circuit according to embodiments of the present invention.

DETAILED DESCRIPTION

Figure 1:
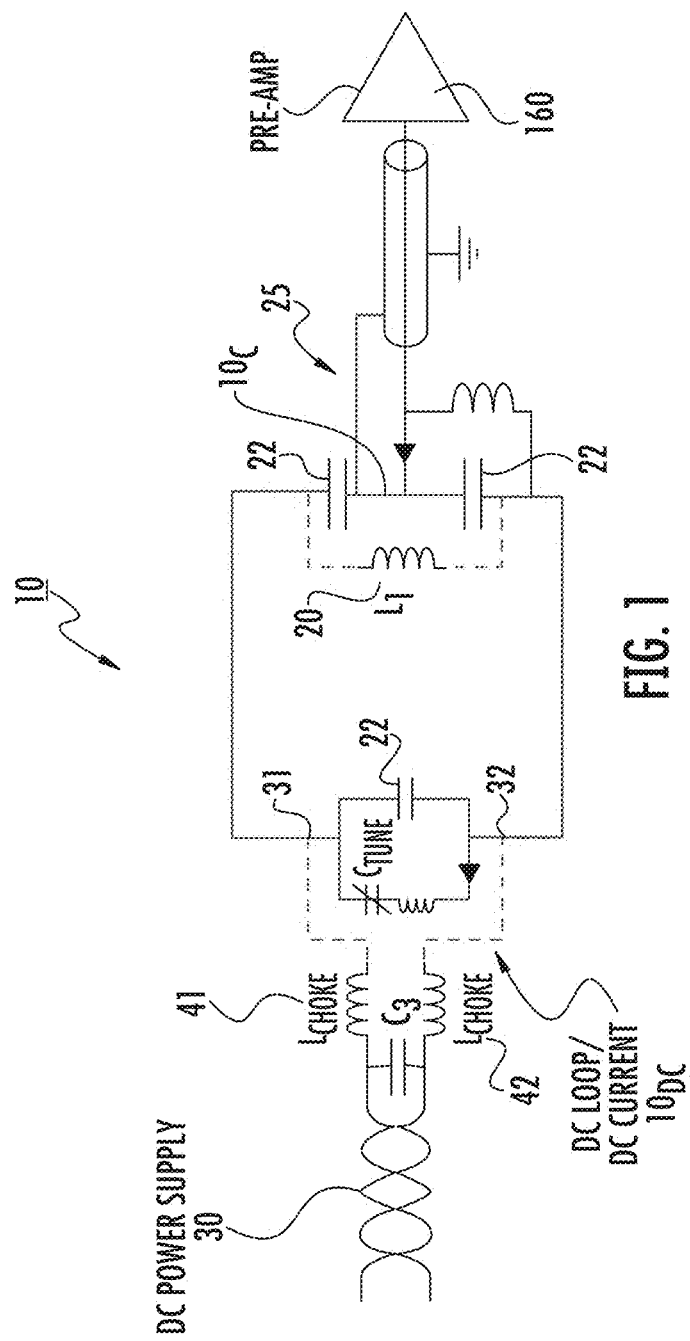
FIG. 1 is a schematic illustration of a single loop coil element of an RF coil according to embodiments of the present invention.

The present invention will now be described more fully hereinafter with reference to the accompanying figures, in which embodiments of the invention are shown. This invention may, however, be embodied in many different forms and should not be construed as limited to the embodiments set forth herein. Like numbers refer to like elements throughout. In the figures, certain layers, components or features may be exaggerated for clarity, and broken lines illustrate optional features or operations unless specified otherwise. In addition, the sequence of operations (or steps) is not limited to the order presented in the figures and/or claims unless specifically indicated otherwise. In the drawings, the thickness of lines, layers, features, components and/or regions may be exaggerated for clarity and broken lines illustrate optional features or operations, unless specified otherwise. Features described with respect to one figure or embodiment can be associated with another embodiment of figure although not specifically described or shown as such. The term "FIG." (whether in all capital letters or not) is an abbreviation of the word "Figure" and each can be used interchangeably in the application (in the drawings and in the text of the specification).

The terminology used herein is for the purpose of describing particular embodiments only and is not intended to be limiting of the invention. As used herein, the singular forms "a", "an" and "the" are intended to include the plural forms as well, unless the context clearly indicates otherwise (i.e. at least one) of the grammatical object of the article. By way of example, "an element" means at least one element and can include more than one element.

It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. As used herein, the term "and/or" includes any and all combinations of one or more of the associated listed items.

It will be understood that although the terms "first" and "second" are used herein to describe various actions, steps or components and should not be limited by these terms. These terms are only used to distinguish one action, step or component from another action, step or component. Like numbers refer to like elements throughout.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the specification and relevant art and should not be interpreted in an idealized or overly formal sense unless expressly so defined herein. Well-known functions or constructions may not be described in detail for brevity and/or clarity.

The term "circuit" refers to an entirely software embodiment or an embodiment combining software and hardware aspects, features and/or components (including, for example, at least one processor and software associated therewith embedded therein and/or executable by, for programmatically directing and/or performing certain described actions or method steps).

The term "programmatically" means that the operation or step can be directed and/or carried out by a digital signal processor and/or computer program code. Similarly, the term "electronically" means that the step or operation can be carried out in an automated manner using electronic components rather than manually or rather than using mental steps. The term "electronically" with respect to connections includes both wireless and wired connections between components.

The term "automatically" and derivatives thereof means that the operation and/or method can be substantially, and typically entirely, carried out without manual input, and is typically programmatically directed and/or carried out.

The terms "MRI scanner" and "MR scanner" are used interchangeably to refer to a Magnetic Resonance Imaging system. The MR scanner includes a permanent or superconducting (high-field) magnet and the operating components, e.g., the RF amplifier, gradient amplifiers and one or more processors that typically direct the pulse sequences and select the scan planes. Examples of current commercial scanners include: GE Healthcare: Signa 1.5 T/3.0 T; Philips Medical Systems: Achieva 1.5 T/3.0 T; Integra 1.5 T; Siemens: MAGNETOM Avanto; MAGNETOM Espree; MAGNETOM Symphony; MAGNETOM Trio; and MAGNETOM Verio. As is well known, the MR scanner can include a main operating/control system that is housed in one or more cabinets or consoles that reside in an MR control room while the MRI magnet resides in the MR scan room. The control room and scan room can be referred to as an MR suite and the two rooms can be separated by an RF shield wall. The term "high-magnetic field" refers to field strengths above about 0.5 T, typically above 1.0 T, and more typically between about 1.5 T and 10 T. Embodiments of the invention may be particularly suitable for 1.5 T, 2.0 QT and 3.0 T systems, or higher field systems such as future contemplated systems at 4.0 T, 5.0 T, 6.0 T, 7.0 T, 9 T and the like. The MR Scanners can be open bore or closed bore systems.

The methods and systems can be used for any target objects including animals and humans or other target material including, for example, inanimate material such as petroleum rock core samples.

The term "patient" refers to humans and animals.

The term "clinician" means physician, neurologist, radiologist, physicist, or other medical personnel desiring to review medical data of a patient. The term "workstation" refers to a display and/or computer associated with a clinician.

The term "about" refers to a parameter that can vary from the recited value, typically between +/−20%.

Each article, reference and patent cited or discussed herein is hereby incorporated by reference as if recited in full herein.

The terms "simultaneously" and "concurrently" are used interchangeably and mean that the noted components are operative for a time period that overlaps or that is coextensive, e.g., substantially concurrently or at the same time.

Existing MRI technologies can use one coil, or separate coils, for transmit and receive purposes to generate and acquire MR signals. Recent parallel imaging technologies in MRI typically require one coil for transmit, and a separate coil array for parallel receive. The term "parallel transmit" means the RF $B_1$ shimming is being performed (not typically used on 3 T, mostly currently used on 7 T). The term "parallel imaging" refers to only parallel receive.

The term "RF coil" refers to a volume coil or coil array configured to transmit an RF excitation pulse or pulse sequence and/or receive MR (RF) signal in response to the excitation pulse for generating NMR spectra or imaging data. The term "RF coil array" refers to an RF coil with a plurality of coil elements which can include transverse electromagnetic (TEM) coil elements.

The term "large" RF coil array refers to an RF coil array with at least 2 coil elements, typically between 2-512 for a particular RF coil array that is sized for a defined target anatomy, including, for example, 4-128 coil elements for a head coil. However, the RF coil array can be generally applicable to a variety of coil geometries designed for different applications, such as cardiac, brain, musculoskeletal or any other parts of human, in vivo or material imaging using any coil shape and any number of coil elements.

The term "RF signal" refers to RF current, RF voltage or RF potential.

The term 'transmit' means RF transmit/transmission or excitation/excite, i.e., transmit the RF field from an RF coil for exciting MR spins in target material such as tissue.

The term "receive" means RF receive/reception, i.e., the RF coil receives the RF signal due to RF field flux change resulted from spin coherence in the target material, e.g., tissue.

In order to acquire MRI image with uniform spatial coverage and without spatial distortion, a homogeneous main static magnetic field ("$B_0$") is required. Conventionally, a homogeneous magnetic field is obtained through whole-body shimming coils to compensate the linear and high-order field inhomogeneities. These whole-body coils, the so-called spherical harmonics (SH) shim coils, cannot effectively correct local or high-order field inhomogeneities. More recently, the advent of local shimming technologies, using a set of direct current (DC) loops closely placed to the imaging sample, showed promise in achieving a more uniform magnetic field $B_0$. However, this technology requires a third set of coils, which takes up additional space and also pushes the imaging coils (the RF transmit and receive coils) further away from the sample, which can result in significantly reduced RF SNR and increased RF power consumption.

Generally stated, embodiments of the invention are directed to a new concept that integrates transmit and/or receive and $B_0$ shimming using the same set of RF coil elements (either RF coil elements or TEM coil elements), which can simultaneously accommodate (i) RF, e.g., alternating current (AC) at radiofrequency (RF) transmit and/or receive and (ii) direct current (DC) to generate local $B_0$ fields for $B_0$ shimming.

Figure 11A:
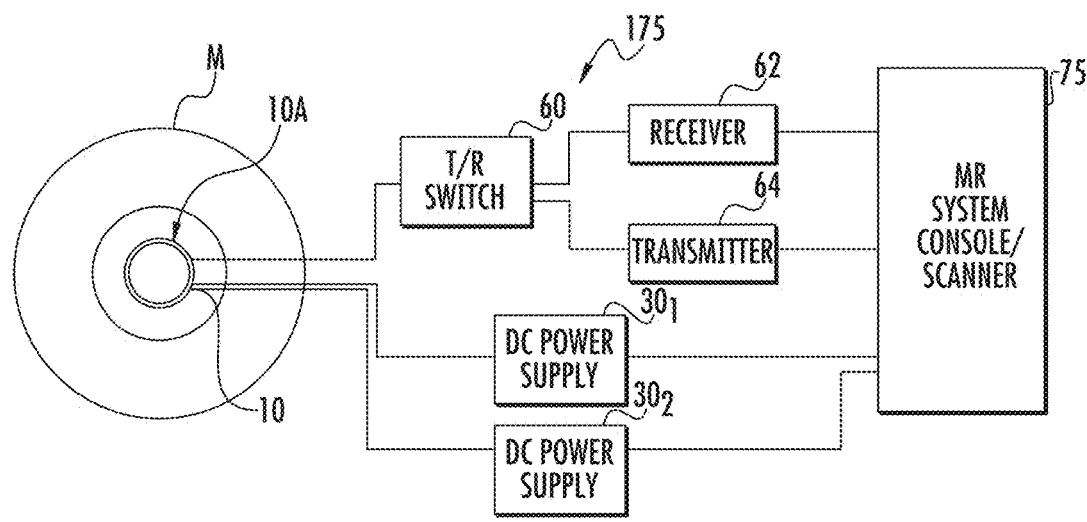
FIG. 11A is a schematic illustration of an MR Imaging system (e.g., MR Scanner) according to embodiments of the present invention.
Figure 13A:
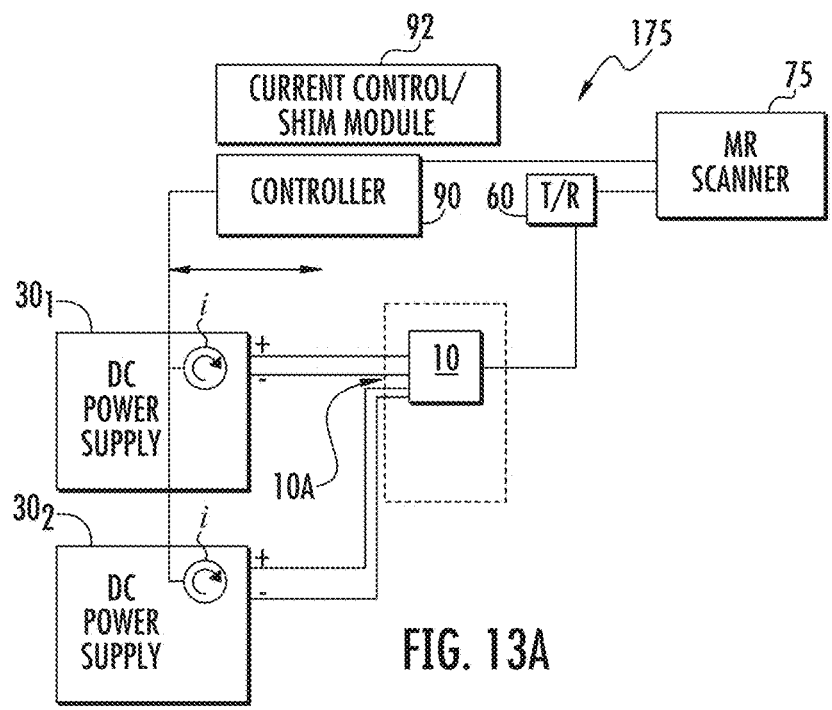
FIG. 13A is a schematic illustration of a circuit in communication with an MR Scanner and an RF coil array(s) according to embodiments of the present invention.

As shown in FIG. 1, in a first implementation of the integrated parallel reception, excitation, and shimming (iPRES), a DC power supply 30 is added to the circuit 10c of the RF coil element 10, along with inductors $L_1$ 20, which can be placed in shunt with (the existing) capacitors 22 or with at least one capacitor 22 in at least one LC resonance circuit 25, to provide an RF-transparent path for a DC current loop $10_{DC}$ (broken line trace in FIG. 1), thereby generating a local magnetic field that can be used for $B_0$ shimming. Additional inductors $L_{choke}$ 41, 42 can be placed between the DC power supply 30 and the RF coil 10 as high-impedance RF chokes to prevent current loss and to maintain the same RF performance. The circuit 10c can electrically communicate with a pre-amplifier 160 (and/or T/R switch 60 (FIGS. 10C, 11A, 13A).

The DC power supply 30 is connected to the circuit 10c at positive and negative terminals (e.g., connections) 31, 32, respectively to form a closed DC loop $10_{DC}$ that allows a DC current to circulate in the coil 10 to generate a local $B_0$ magnetic field. The closed loop DC circuit $10_{DC}$ is illustrated by the broken line residing on the top and bottom of the outer perimeter line. Current can circulate in either direction and can be individually adjusted for each coil element 10 or sets of coil elements in respective coil arrays to allow for controlled shimming to produce a uniform $B_0$ field using the local $B_0$ fields.

As shown in FIG. 1, there is a single one DC loop $10_{DC}$ per RF coil element 10 and the DC loop $10_{DC}$ is typically constrained to have a similar, or the same, size and shape as the RF coil element. As a result, localized $B_0$ inhomogeneities with spatial variations smaller than the size of the DC loop $10_{DC}$ may not be fully corrected.

Figure 2:
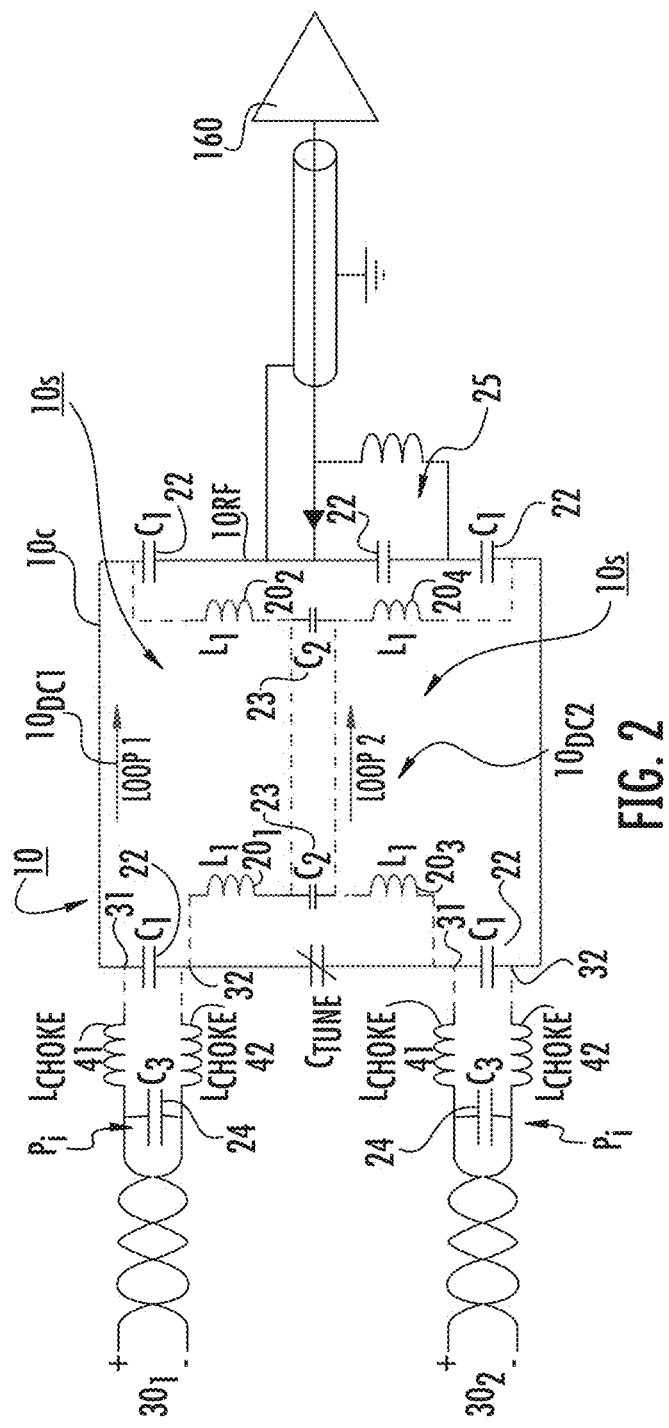
FIG. 2 is a schematic illustration of a coil element of an RF coil able to operate with split DC (direct current) loops according to embodiments of the present invention.
Figure 3:
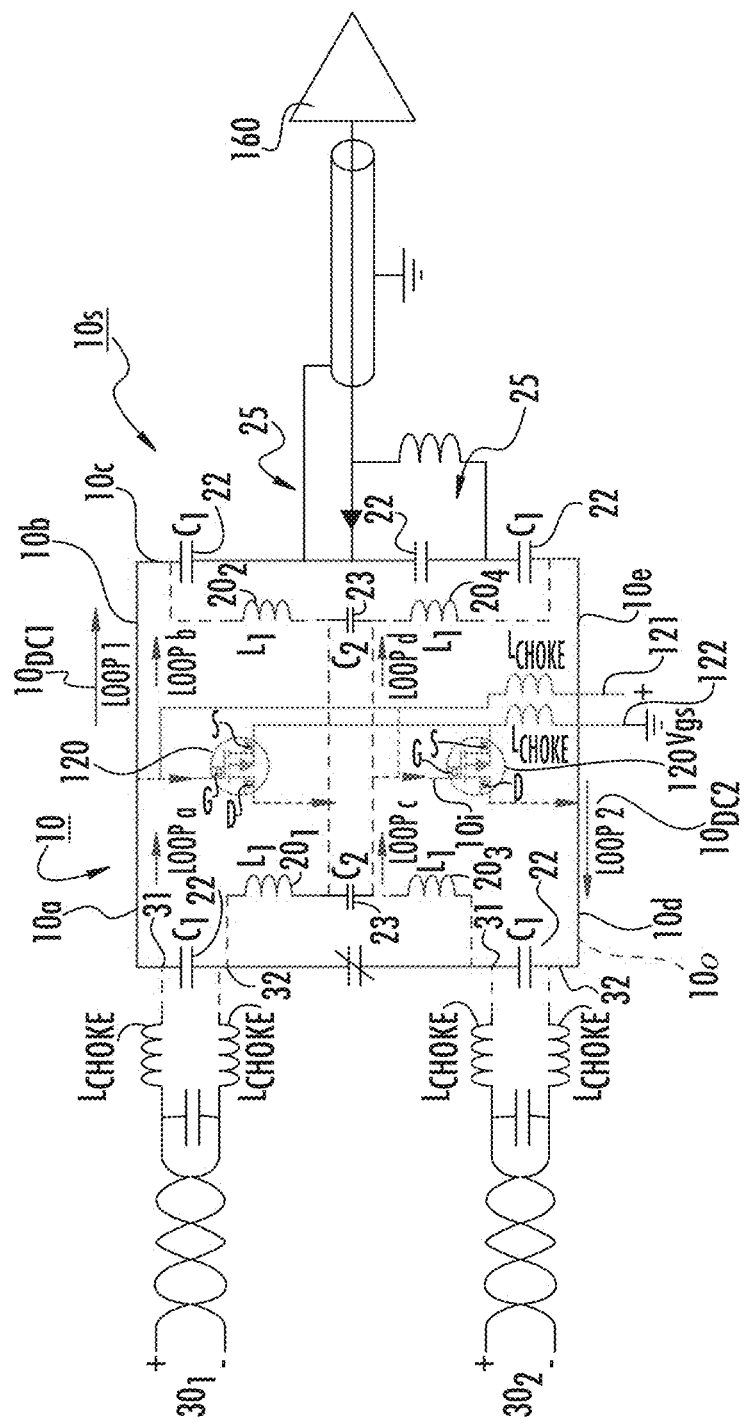
FIG. 3 is a schematic illustration of another exemplary embodiment of a split loop coil element of an RF coil with a switchable configuration according to embodiments of the present invention.

FIGS. 2 and 3 illustrate that a respective RF coil element 10 can be configured to have "split" DC loops so as to have more than one DC loop $10_{DC}$ to thereby increase spatial resolution by increasing the number of magnetic fields available for $B_0$ shimming within a respective RF coil (element) 10.

The coil element 10 can be in any shape or geometry to form a continuous path for the DC current, e.g., a continuous path shaped as a circle, square, rectangle, triangle, FIG. 8, etc. Thus, the term "loop" is used broadly to refer to a closed or substantially closed, electrically continuous path that can circulate DC current in a desired direction, e.g., clockwise or counterclockwise. The coil element 10 can be formed as a single layer of wire or conductor or multiple stacked layers of wire or conductor. Different coil elements of a single array 10A (FIG. 10B) can have different geometries or the same geometries. Different cooperating RF coil arrays (where more than one RF coil array is used) can have the same or different element geometries.

The split DC loop configuration adds flexibility to increase the number of DC loops $10_{DC}$ within a respective RF coil element 10. The split DC loops can be used to adjust the DC loop size and shape and/or allow individual ones of the split DC loops to be independently adjustable for DC current flow for shimming which may improve the local $B_0$ shimming capability.

The term "split DC loop" and derivatives thereof refer to an RF coil element conductor (e.g., RF conductor circuit loop) that is electrically partitioned (e.g., split) into multiple, smaller DC loops $10_{DC}$ using an RF-specific system of components (inductors and capacitors) that can substantially maintain the same RF performance of a respective RF coil element.

Each of the split DC loops of a respective coil/coil element 10 can use an independent DC current to create different magnetic fields within the RF coil/coil element. In some embodiments, they may use a different DC power supply. In some embodiments, some or all of the split DC loops of a respective RF coil element can share a common DC power supply.

The split DC loops can provide a higher number of degrees of freedom and an increased spatial resolution to shim localized $B_0$ inhomogeneities with spatial variations smaller than the size of the RF coil, resulting in higher fidelity images as compared to existing technologies. The split DC loop design can effectively minimize the electromagnetic shielding effect commonly seen in traditional local shimming technologies where separate DC shimming loops are used.

FIG. 2 illustrates, by way of example only, that the split DC loops 10s of a respective coil element 10 can include first and second separate DC loops $10_{DC1}$, $10_{DC2}$ within a single RF coil element 10. The red (darker) perimeter rectangle is the RF current loop $10_{RF}$ and the broken-line perimeters (blue) of two smaller loops represent the independent DC current loops, Loop 1, and Loop 2, $10_{DC1}$, $10_{DC2}$, respectively. Two independently controllable DC power supply inputs $30_1$, $30_2$ can be used to drive the two split DC loops $10_{DC1}$, $10_{DC2}$ independently.

The RF coil element 10 can include at least four spaced apart inductors $L_1$ $20_1$-$20_4$, at least two for each DC loop $10_{DC1}$, $10_{DC2}$, can be employed to provide the two separate DC paths $10_{DC1}$, $10_{DC2}$ about the RF coil 10, creating two local, independent magnetic fields that can be used for $B_0$ shimming.

Capacitors $C_2$ 23 can be positioned between pairs of inductors $L_1$ $20_1$, $20_3$ and between pairs of inductors $L_1$ $20_2$, $20_4$ of each different DC current loop paths $10_{DC1}$, $10_{DC2}$ to electrically isolate the two DC current paths and/or to separate and form adjacent cross-segments of the different DC current paths $10_{DC1}$, $10_{DC2}$. The capacitors $C_2$ 23 are shown as two capacitors $C_2$, but may be provided as more than two, and are added in shunt between the two DC loops to provide additional RF isolation.

Capacitors $C_1$ 22 (shown as four capacitors, but more may be used) can be added to the circuit 10c to prevent DC currents from flowing to the RF feed structure. Capacitors C1 22 can alternatively or additionally be configured to provide feed sets of positive and negative terminals or connection points 31, 32 for the DC power supplies $30_1$, $30_2$. Thus, one or more capacitor(s) C1, 22, can reside between the feed points 31, 32 for a respective power supply 30. The pairs of terminals 31, 32 can be closely spaced to opposing sides of the at least one capacitor 22 which can be facilitated by using a DC twisted pair for connection.

DC current can circulate in either direction and can be individually adjusted for each coil element 10 or sets of coil elements in respective coil arrays 10A (FIG. 10B) to allow for controlled shimming to produce a uniform $B_0$ field using the local $B_0$ fields.

Circuit components, such as a Pi network, i.e., a capacitor $C_3$ 24 can be placed in shunt between two chokes, $L_{choke}$ 41, 42, to increase the isolation between the DC power supplies $30_1$, $30_2$ and the RF coil element 10, substantially or totally maintaining the S-parameters of the original RF coil 10. The DC current from the respective DC power supplies $30_1$, $30_2$ can pass through the inductors $L_{choke}$ 41, 42 while the Pi network acts as an RF bandstop filter.

The implementation of the split DC loops 10s in a respective coil 10 can be either static (as shown in FIG. 2) or dynamic, in which case the size and shape of the DC loops, e.g., $10_{DC1}$, $10_{DC2}$, can be adjusted as needed, resulting in an even higher flexibility for $B_0$ shimming.

As shown in FIG. 3, in some embodiments, a dynamic implementation can be achieved by using switches 120, such as, but not limited to, FET switches along with additional RF-choked power lines 121, 122 to activate the switches 120. In this "simple" example, when the FET switches 120 are off (high impedance), the coil 10 has the same two-loop configuration $10_{DC1}$, $10_{DC2}$ shown in FIG. 2. When a voltage is applied gate-to-source of the FET 120, the FET switches 120 produce four (smaller) DC loops $10_{DC}$ (loops 10a, 10b, 10d and 10e) with DC currents based on the internal and any added resistance (not shown) at the switches 120. This switchable design can be extrapolated to use multiple switches for additional DC current paths, amplitudes, and geometries. Although shown by way of example as FET switches, diodes, DPDT switches, or combinations thereof and/or other circuit switch components may be used.

As shown in FIG. 3, the four smaller DC current loops 10a, 10b, 10d and 10e each have one outer segment 10o that is defined by the RF coil element conductor for the RF current path and an inner segment 10i that extends from the outer segment across the FET switch 120. Each of the four smaller DC loops 10a, 10b, 10d and 10e can have the same or different sizes and shapes, depending on the placement of the electrical components forming respective DC current loops, e.g., the FET switches 120 and the inductors 20 and capacitors 22 forming respective DC current loops, although shown as having the same shape and size in FIG. 3. However, it is possible that a DC loop may have no outer perimeter segment in common with the RF coil element 10 (e.g., RF path $110_{RF}$). For example, a middle loop of a multiple-split loop configuration where the RF coil element is split into a 3×3 matrix of DC loops (not shown).

The split or smaller DC loops $10_{DC}$ can be provided in any suitable number for a respective coil element. Different coil elements of an RF coil or RF coil array can have different numbers of split DC loops, e.g., typically between 2-12, either "static" or dynamic DC loops, for example. Thus, although shown as four smaller DC loops $10_{DC}$ in FIG. 3 and two static DC loops $10_{DC}$ in FIG. 2, a respective coil element 10 can have more than that shown.

Coil elements of a respective RF coil or RF coil array can include combinations of single DC loops $10_{DC}$, split static and split dynamic DC loops $10_{DC}$ for different coil elements or sets of coil elements. Different coil elements may have different numbers of split DC loops 10s or the same number of split DC loops 10s.

Figure 4:
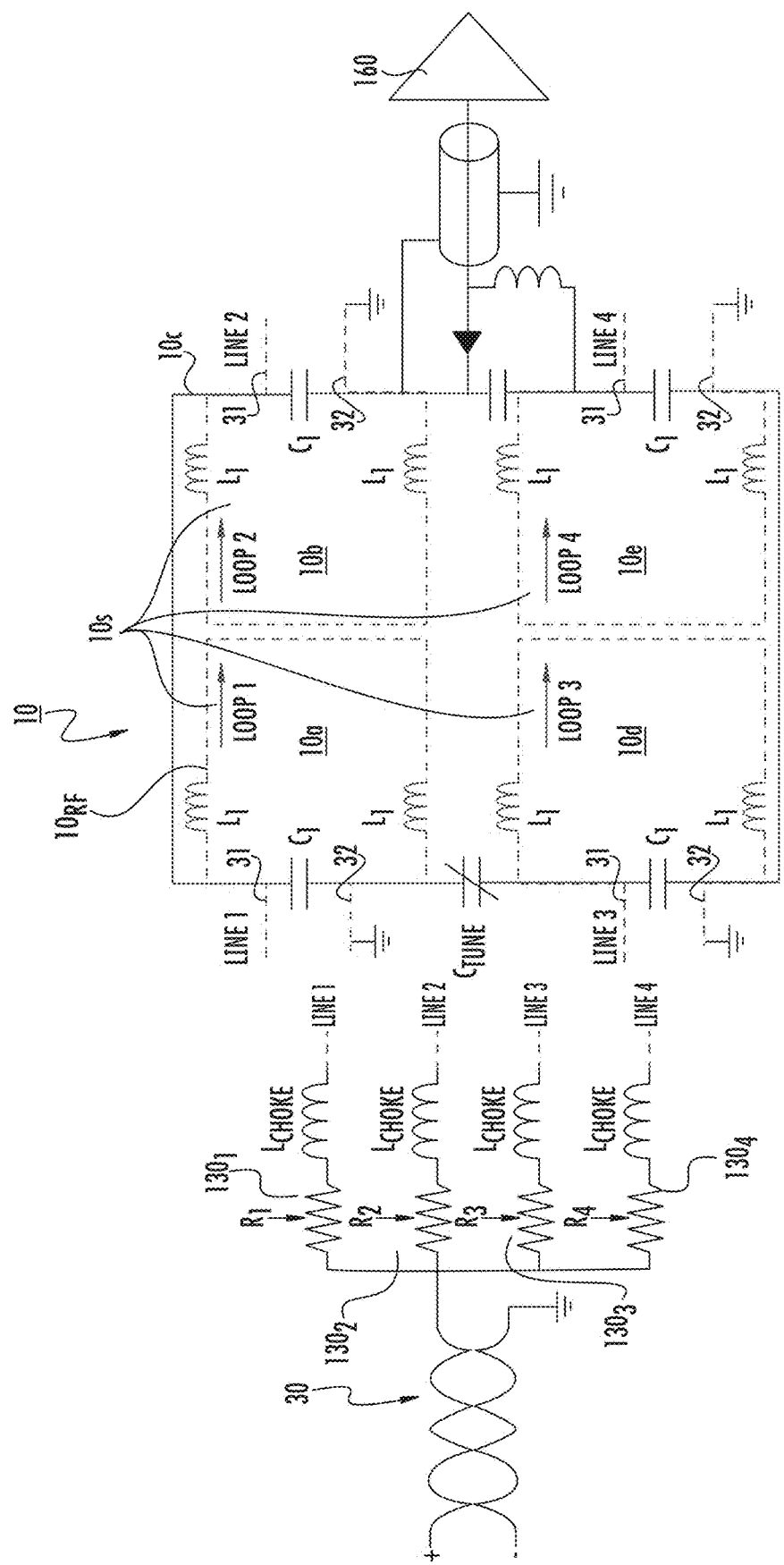
FIG. 4 is a schematic illustration of yet another exemplary embodiment of a loop coil element of an RF coil according to embodiments of the present invention.
Figure 5A:
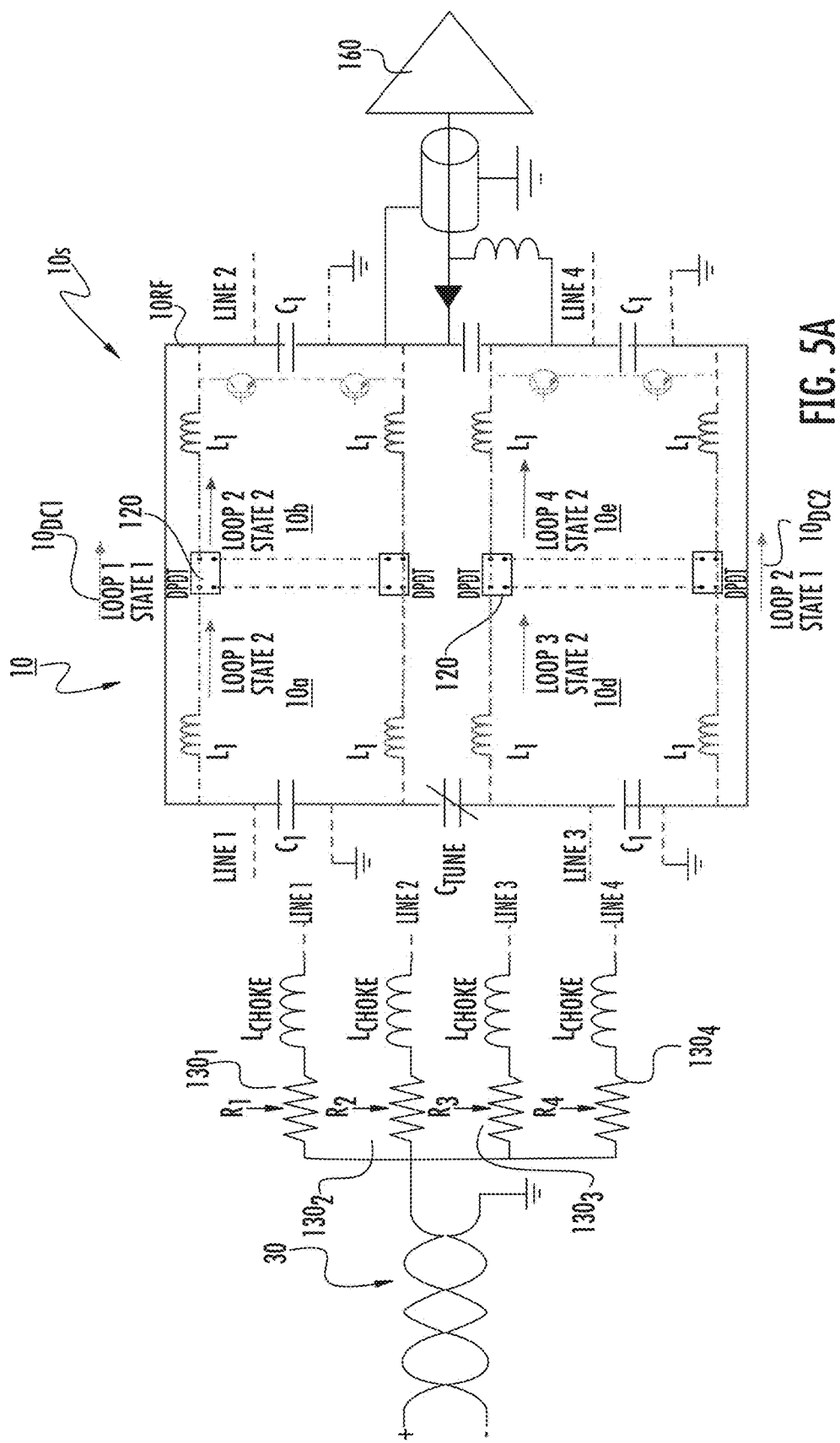
FIG. 5A is a schematic illustration of yet another exemplary embodiment of an RF coil element with a switchable loop configuration (shown without the gate voltage and control lines for switches) according to embodiments of the present invention.
Figure 5B:
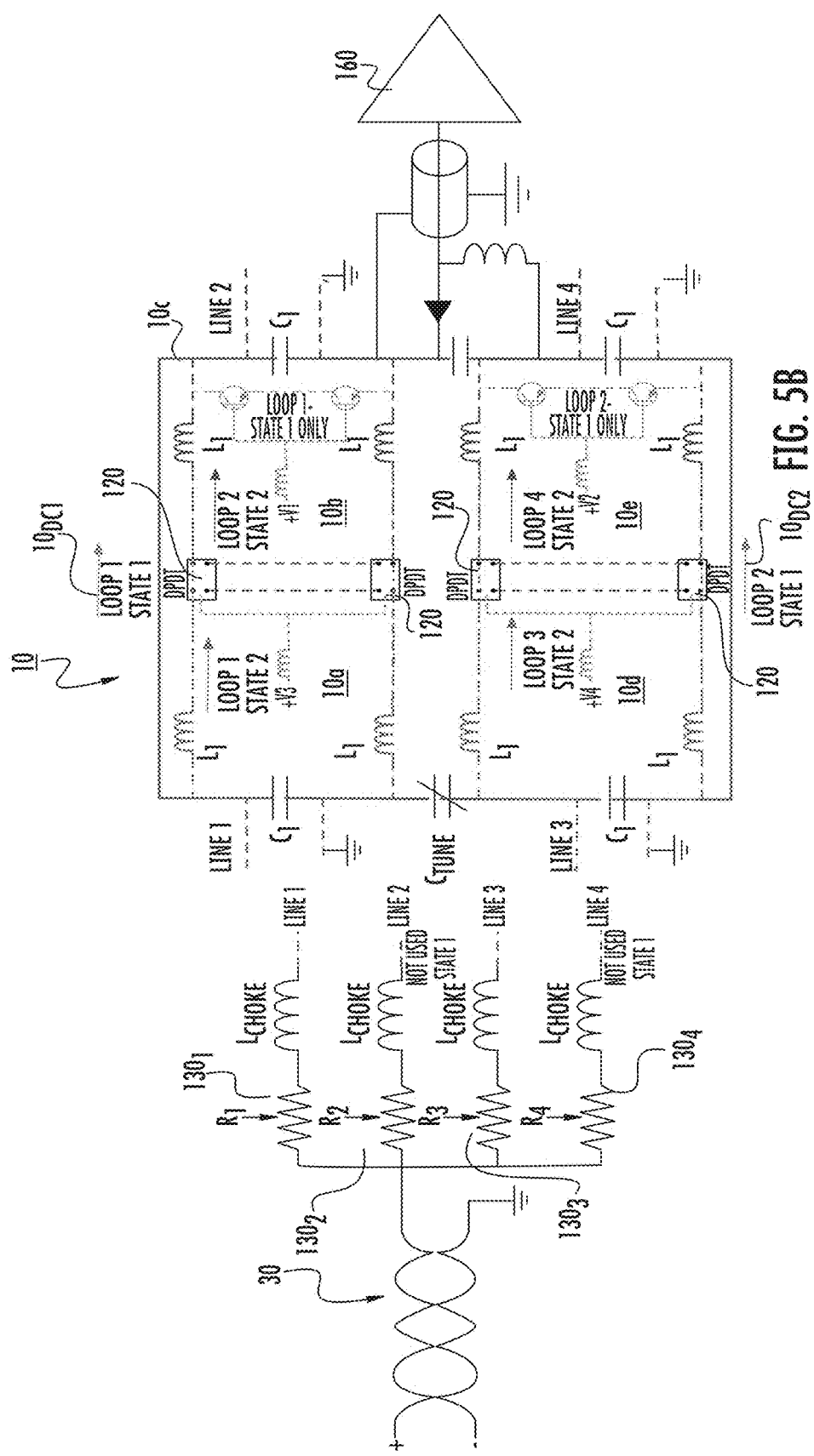
FIG. 5B is a schematic illustration of the RF coil element configuration shown in FIG. 5A illustrated with exemplary gate voltage and control lines for switches according to embodiments of the present invention.

FIGS. 4, 5A and 5B illustrate an RF coil element 10 with a split DC loop configuration 10s in communication with a single DC power supply 30 and four variable resistors $130_1$-$130_4$, to allow all the loops 10s of a respective coil element 10 to be fed from a single power supply 30 while the variable resistors can be used to generate different current in each DC loop 10a, 10b, 10d and 10e, provided the DC power supply 30 can generate a sufficiently large total current to feed the DC loops 10a, 10b, 10d and 10e.

FIG. 4 illustrates a "static" split loop configuration similar to FIG. 2 discussed above. FIGS. 5A and 5B illustrate an example of a "dynamic" or "switchable" configuration similar to FIG. 3 discussed above. Thus, a single DC power supply 30 or more than one DC power supply 30 can be used for a respective coil element 10. Each split DC loop $10_{DC}$ of a respective RF coil element 10 can share a DC power supply with another of the split loops of that RF coil element or may have a dedicated DC power supply.

As noted above, the RF coil elements 10 with split DC loops 10s integrates multiple smaller DC loops within each RF coil element 10 and removes their geometric dependence on the size and shape of the RF coil element. For example, splitting each RF coil element of a 32-channel head coil array into two DC loops, yields 64 independent smaller DC loops that can be used for $B_0$ shimming. When dynamic switching is employed, this can be extended to 128 independent loops, for example. The split loop 10s coil design can increase the number of degrees of freedom and the spatial resolution available for $B_0$ shimming, resulting in a more effective shimming of localized $B_0$ inhomogeneities with spatial variations smaller than the size of the RF coil.

As shown in FIG. 5A, in one active state, the RF coil element 10 can have two split DC loops $10_{DC1}$, $10_{DC2}$. In the second active state, the RF coil element can have additional split loops 10s. For example, as shown the first loop, Loop 1, $10_{DC1}$, can be sub-divided into smaller DC loop components, shown as loops 10a, 10b, for example. Similarly, the second loop, Loop 2, can be split into first and second smaller DC loop components, 10d, 10e. In this embodiment, first and second spaced apart DPDT (double pole double throw) switches 120 can connect interior legs of the smaller split loops 10a, 10b or disconnect them so that current flows in the larger loop, Loop 1. Thus, the DPDT switches 120 can be electronically, controllably directed to change the number of split loops for different switch states. Examples of gate voltage and control lines for the RF coil element with the split DC loops shown in FIG. 5A are shown in FIG. 5B.

In the switched implementation, the flexibility to tailor the configuration of the DC loops $10_{DC}$ to specific $B_0$ inhomogeneities may be further improved. While switched DC loops have been implemented previously into a separate shim coil array, they have not been implemented into an integrated RF/shim coil array, losing the advantages gained by having both the shim and RF coils in close proximity to the subject. See, e.g., Harris C, Handler W, Chronik B, A new approach to shimming: the dynamically controlled adaptive network. Magnetic Resonance in Medicine. 71(2), 859-869 (2013), the contents of which are hereby incorporated by reference as if recited in full herein.

Embodiments of the invention can provide a number of advantages over known existing technologies. First, the need for separate arrays for RF transmit, RF receive, and $B_0$ shimming can be eliminated into one or two arrays thereby saving limited radial space in the MRI bore and potentially reducing manufacturing cost of MRI scanners. Second, in some embodiments, the imaging coils (RF transmit and receive) and shimming coils can all be placed at a close distance to the imaging object, as the different functions can be integrated into one array, thereby greatly increasing the signal-to-noise ratio (SNR) and reducing RF power consumption. Third, in some embodiments, by using a single set of coils for RF transmit/receive and $B_0$ shimming, the electromagnetic interferences between the outer. RF array and inner shimming array (which acts as a shield) associated with existing technologies can be avoided.

In addition, embodiments of the invention are suitable for all MRI systems, but may be particularly useful for high field (e.g., 3 T) or ultra-high field (e.g., 7 Tesla and above) MRI, as it can address both $B_1$ and $B_0$ inhomogeneities by allowing effective $B_1$ and $B_0$ shimming close to the imaging object and to achieve uniform $B_1$ and $B_0$ magnetic field.

It is also contemplated that, in some embodiments of the invention, the RF coils with a DC mode can be configured to generate local $B_0$ fields for spatial encoding instead of for $B_0$ shimming.

Figure 6:
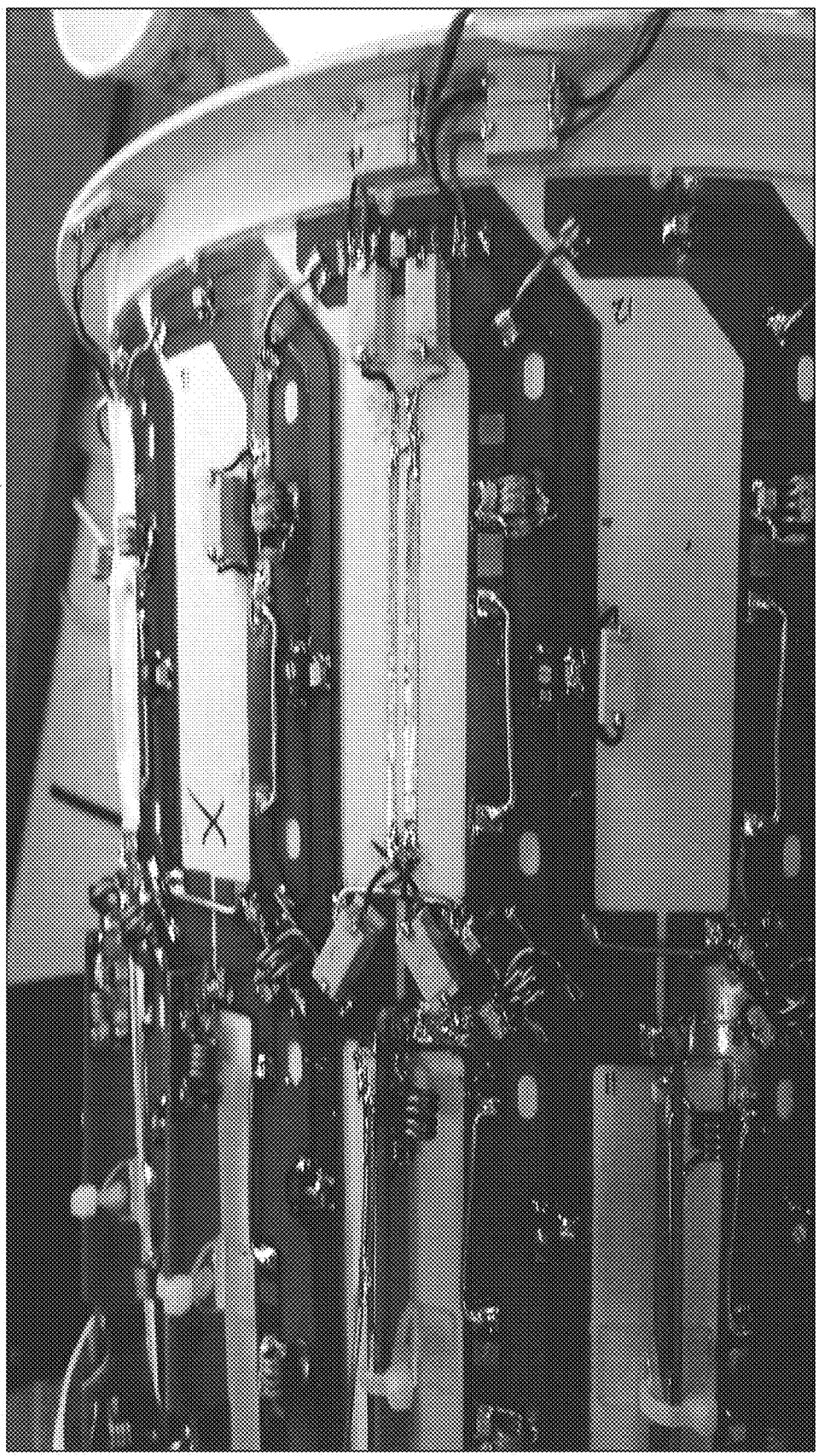
FIG. 6 is a digital image of a prototype RF coil with an RF coil element having two split DC loops according to embodiments of the present invention.

FIG. 6 is a digital image of a coil prototype that was constructed by modifying a conventional 32-channel RF head coil array 10A. One of the coil elements 10 was modified to have two split DC loops $M_{DC}$ based on the embodiment shown in FIG. 2.

The values of the inductors and capacitors were $L_1$=1.2 µH, $C_1$=1000 pF, $C_2$ =100 pF, $C_3$=100 pF, and $L_{choke}$=1.2 µH. It is noted that these values as well as the implemented matching circuit are provided by way of example only and are not intended to be limiting to the new configuration as they are specific to the coil prototype and a 3 T scanner. The components and values of the components can be adjusted for any coil and field strength. Furthermore, while this proof-of-concept prototype only contained two split DC loops with a fixed configuration, other implementations can include a larger number of DC loops with or without FET or other switches to dynamically change the configuration of the DC loops.

The prototype coil was tuned on a calibrated Rhode and Schwarz ZNB4 vector network analyzer. The RF S-parameters were measured to ensure that the Q value of the coil did not degrade after the coil modification.

Initial experiments were performed on a GE MR750 3 T scanner using the coil 10 with two split DC loops 10s described above to demonstrate its ability to simultaneously perform RE reception and generate two independent $B_0$ fields from the two DC loops.

Referring to FIGS. 7A-7E, a spherical phantom was positioned such that it was aligned with the center of one of the DC loops, while the other one was slightly to the left. Coronal $B_0$ maps were acquired using a multi-echo gradient-echo sequence (repetition time (TR)=530 ms, echo times (TEs)=1.5, 11.2 ms, voxel size=4×4×4 mm) with no DC current (FIG. 7A), with a 0.9 A DC current separately applied in each DC loop (FIG. 7B and 7C), and with a 0.9 A DC current simultaneously applied in both DC loops (FIG. 7D). An additional $B_0$ map (FIG. 7E) was generated by adding the two $B_0$ maps shown in FIGS. 7B and 7C for comparison with the measurement (FIG. 7D). FIGS. 7B and 7C show that the coil can generate two independent and spatially distinct $B_0$ fields from the two DC loops. FIGS. 7D and 7E further show that these $B_0$ fields are additive, as expected.

Images were also acquired using a spin-echo echo-planar imaging (EPI) sequence (TR=2 s, TE=30 ms, field-of-view=25.6 cm, matrix size=128×128, slice thickness=4 mm) with the same DC currents as described above and are shown in FIGS. 8A-8D, below the corresponding $B_0$ maps in FIGS. 7A-7D. These images show different patterns of geometric distortions resulting from the different magnetic fields generated by the DC currents.

Additional experiments were carried out to demonstrate that the iPRES coil with split DC loops (per the embodiment shown in FIG. 2) can actually perform $B_0$ shimming and correct for geometric distortions and that it can provide a more effective shimming of localized $B_0$ inhomogeneities than the iPRES coil with a single DC loop (FIG. 1).

To ensure a fair comparison between these two RF coil elements (hereafter referred to as the split and non-split coils, respectively), a first experiment was performed using the split coil described above (FIG. 2). This coil was then modified to include only a single DC loop covering approximately the same area as the two split DC loops (similar to FIG. 1). The phantom remained in the same position with respect to the coil for both experiments, which were performed in the same scan session.

For both experiments, two additional RF-isolated DC perturbation loops were inserted between the split (or non-split) coil and the phantom and driven by two additional DC power supplies. A +0.9 A and −0.9 A DC current was then applied to each perturbation loop, respectively, to introduce asymmetrical $B_0$ inhomogeneities across the respective split and non-split RF coils.

In the experiment performed with the non-split coil, a $B_0$ map was first acquired with the perturbation applied, but no DC current applied in the coil. Next, a basis $B_0$ map was acquired with a 0.9 A DC current applied in the coil, but no DC currents applied in the perturbation loops. The optimal DC current to apply in the coil to correct for the perturbation was then computed by minimizing the root-mean-square error (RMSE) between the $B_0$ map acquired with the perturbation and the basis $B_0$ map.

Similarly, in the experiment performed with the split coil, a $B_0$ map was first acquired with the perturbation applied, but no DC currents applied in the coil. Next, two basis $B_0$ maps were acquired with a 0.9 A DC current separately applied in each split DC loop, but no DC currents applied in the perturbation loops. The optimal DC currents to apply in the split DC loops to correct for the perturbation were then computed by minimizing the RMSE between the $B_0$ map acquired with the perturbation and a linear combination of the basis $B_0$ maps.

As shown in FIGS. 9A and 19B EPI images were acquired with the same parameters as above using the split coil (FIG. 9A, top set of images) and the non-split coil (FIG. 9B, the bottom set of images) with no DC current (FIGS. 9A and 9B, left), with the perturbation applied (FIGS. 9A and 9B, middle), and with the perturbation corrected (FIGS. 9A, 9B, right).

When the perturbation is applied, the EPI images acquired with either coil are stretched on the left and compressed on the right because of the asymmetrical $B_0$ inhomogeneities introduced by the opposite DC currents applied in the two perturbation loops (FIGS. 9A, 9B middle). These geometric distortions are greatly reduced when shimming with the split coil (FIG. 9A, right), but not when shimming with the non-split coil (FIG. 9B, right), as expected.

Both the EPI images and $B_0$ RMSE (shown in Table 1 below) demonstrate that the split coil 10s can provide a more effective shimming of localized $B_0$ inhomogeneities than the non-split coil due to the larger number of degrees of freedom and ability to achieve a more flexible spatial control of the $B_0$ field used for shimming.

TABLE 1

$B_0$ RSME (Hz).

| | with perturbation applied | with perturbation corrected | % change |
|---|---|---|---|
| non-split coil | 13.9 | 13.7 | −1 |
| split coil | 13.1 | 9.8 | −25 |

Even though there may still be residual distortions after shimming with the split coil, because these proof-of-concept experiments were only performed with a single coil rather than a coil array, the results nevertheless demonstrate the advantages and usefulness of the invention. Implementing the split coil design into each or a plurality of coil elements, typically into a full iPRES coil array, such as a 32-channel head coil array, is straightforward and should provide an even more effective $B_0$ shimming as compared to an iPRES coil array with only one DC loop per coil element.

In some embodiments, parallel reception, excitation, and shimming can be carried out using a single coil array, as opposed to the traditional technology where separate arrays are needed. One can compare a conventional system shown in FIG. 10A with a coil array 10A with a split DC loop configuration shown in FIG. 10B according to embodiments of the present invention. In the conventional system shown in FIG. 10A, separate RF 5A and shim arrays 8A are required for RF transmit/receive and shimming (left).

In FIG. 10B, element 10A can mean three different cases: a receive-only RF array integrated with Bo shimming, a transmit/receive RF array integrated with Bo shimming or a transmit-only RF array integrated with Bo shimming.

In some particular embodiments, integrated transmit/receive and shimming can employ one coil array 10A (right) with all coil elements 10 at a common radial distance from an axially extending centerline of the magnet bore (and object).

The inductors $L_1$ 20 can sufficiently maintain the RF SNR as compared to the original (conventional) RF coil. The coil element 10 can be configured as a dual-tuned or multi-tuned RF coil with high and low resonance frequencies, but with substantially no (or no) degradation in performance as compared to a conventional (e.g., "original") coil at the target resonance frequency.

As with the single DC loop configurations, different configurations and electrical components of split DC loops and circuits 10c of coil elements 10 are contemplated. The width/length or diameter (average) of the RF coil element 10 can be any suitable size, typically between about 1 mm to about 30 cm and any value therebetween, such as between about 10 mm to about 15 cm, including about 1 cm, about 2 cm, about 3 cm, about 4 cm, about 5 cm, about 6 cm, about 7 cm, about 8 cm, about 9 cm and about 10 cm.

As described in co-pending PCT Patent Application Publication WO2014/003918, the capacitor 22 in the parallel LC circuit 25 (FIG. 2) can be one or more capacitors, such as two spaced apart capacitors with an electrical ground between them. The content of this document is hereby incorporated by reference as if recited in full herein. However, other RF coil element circuit 10c configurations may be used including more than two capacitors and more than one parallel LC circuit 25. Also, while it is contemplated that a dual tuned circuit configuration may be used, the different LC resonance circuit configurations can be configured as a multiple tuned RF circuit instead of a dual tuned RF circuit if multiple parallel LC circuits are not exactly the same between each other (i.e., they have different $L_1$ and/or $C_1$ values). The respective coil elements 10 can include at least one tuning capacitor and at least one matching capacitor. The matching capacitor can reside outside the DC loop $10_{DC}$ in a matching circuit between the loop $10_{DC}$ and a transmit/receive switch 60.

The DC power input can be across any one or more capacitors in a respective coil element circuit 10 but the inductor (which may otherwise be in parallel with the capacitor) should be removed.

Also, the labeling of the inductor/capacitors in the figures are for ease of discussion and the nomenclature $L_1$ and $C_1$ and the like, can mean different values for different component placement, e.g., different LC circuits in the same coil element or in a different coil element.

Summarized, the addition of at least one inductor $L_1$ 20 across the (at least one) capacitor 22 in the at least one LC resonance circuit 25 along with at least one DC power supply 30 forms a split DC loop path for DC current to flow in the coil 10 along a continuous or closed paths in a respective single RF coil element generating additional (local) $B_0$ fields that can be used for $B_0$ shimming.

When DC current flows through the at least one inductor 20 of the different split DC loops 10s, RF signal flows primarily across the corresponding capacitor 22 of the at least one LC resonant circuit 25. That is, RF signal flows primarily across the capacitor but (e.g., a very small portion of) RF signal may still flow across the inductor in parallel but does not interfere with the DC mode.

It is also noted that the RF chokes 41, 42, where used, can be positioned further away from a patient (e.g., rather than mounted on the body of the RF coil support, e.g., head coil). The Lchokes can be sized and configured to prevent the propagation of RF currents. The RF chokes can be used to block AC while passing DC. Common-mode chokes prevent interferences (they are also called cable-traps or, at high frequencies, baluns). An RF/Lchoke is typically a coil of insulated wire, often wound on a magnetic core, used as a passive inductor which blocks higher-frequency alternating current (AC) in an electrical circuit while passing signals of much lower frequency and direct current (DC). However, it is contemplated that circuit configurations may operate in an appropriate manner without Lchokes.

As shown in FIG. 10C (the DC loop is shown as a single rather than split DC loop but the DC split loops 10s as described above can be used with the other circuit components), the coil element 10 can also be in communication with an RF balun 50 or other circuit feature that can reduce RF coupling between the coil element 10 and a surrounding environment. As is well known to those of skill in the art, the term "RF Balun" refers to the common-mode choke in RF coils. It presents low impedance to the signal current which is in differential mode and allows DC coupling. To the common mode current it presents itself as a high impedance choke. Mostly a balun is placed in coil cables to reduce common mode RF current of cable shield. The common mode current generates unnecessary coupling and heating of the RF coils and cables. A balun clearly defines the boundary between the RF coil and coax cable connecting to the coil. The RF signal can be readily received after the balun by the MRI system through a Transmit/Receive switch 60 that connects directly or indirectly to the MR Scanner 75 (FIG. 11A) as is well known. As a result, both the RF and DC currents can flow in the same coil structure simultaneously (and independently) with no interference from each other.

As also shown in FIG. 10C, the RF coil element 10 can be in communication with an optional active detuning circuit 200. The active detuning circuit 200 can include a DC blocking capacitor 210. The active detuning circuit 200 may be particularly suitable for a receive only RF coil array 10A that provides the DC current for shimming. Generally stated, when the PIN diode 220 is reverse-biased, the detuning circuit 200 has no impact on the circuit 10c and both the RF and DC currents in the FIG. 8 pathway remain unaffected. When the PIN diode 220 is forward-biased, a parallel resonant circuit is formed by the capacitors $22_1$, $22_2$ Cf1 and Cf2, respectively, the inductor $L_1$ 20, the DC-blocking capacitor 210, and the detuning inductor 215, which allows the RF current to flow into the detuning circuit 200 and which detunes the coil 10. However, the DC current for $B_0$ shimming remains in the circuit 10c (shown by way of examples as a FIG. 8 pathway), since it is isolated from the detuning circuit by the DC-blocking capacitor 210. This current is also isolated from the small DC current (e.g., 200 mA) used to drive the PIN diode, which flows in the small loop containing the PIN diode 220, the DC bias 225, and the (two) RF chokes 226. Therefore, the DC current for $B_0$ shimming remains unaffected regardless of whether the coil is detuned or not.

The DC current provided by the one or more DC power supplies 30 to any individual coil element 10 can be any suitable value, typically between about 0-30 A, and can be adjustable to flow in either direction in the split DC current loops 10s, preferably but not required, with each split loop being adjustable in the amount of current. To clarify, any suitable DC current can be used, e.g., between about 0-50 A (amperes), typically between about 1-30 A, or above 30 A or even above 50 A. In some embodiments the DC current is about 1 A, about 2 A, about 3 A, about 4 A, about 5 A, about 6 A, about 7 A, about 8 A, about 9 A, about 10A, about 11 A, about 12 A, about 13 A, about 14 A, about 15 A, about 16 A, about 17 A, about 18 A, about 19 A, about 20 A, about 21 A, about 22 A, about 23 A, about 24 A, about 25 A, about 26 A, about 27 A, about 28 A, about 29 A, about 30 A, about 35 A, about 40 A, or about 50 A . In some embodiments the DC current for a respective split DC loop can exceed the 50 A exemplary range. The recited current range and values are by way of example only.

Exemplary values for certain circuit features are provided below by way of description only, without being limited to the ranges for the various components of a coil element.

At 3 T, the circuit 10c can have high and low frequencies are about 128 MHz and about 27 MHz, respectively. General ranges of components for 3 T operation include: inductor Lchoke or L1 ranges from 50 nH to 2.5 uH, L2 ranges from 300 nH to 2.5 uH, Cf range (0-30 pf), Cm ranges (0-30 pf), RF balun (inductor=100 nH to 2.5 uH, capacitor=0-30 pf).

At 1.5 T, the circuit 10c can have high and low frequencies that are about 64 MHz and about 13 MHz, respectively. The general ranges of components at 1.5 T can be: inductor (Lchoke or L1) ranges from 100 nH to 2.5 uH, L2 ranges from 300 nH to 2.5 uH, Cf range (0-40 pf), Cm ranges (0-40 pf), RF balun (inductor=200 nH to 2.5 uH, capacitor=0-40 pf).

At 7 T, the circuit 10c can have high and low frequencies that are about 298 MHz and about 63 MHz respectively. The general ranges of components can be: inductor (Lchoke or L1) ranges from 20 nH to 2 uH, L2 ranges from 50 nH to 2 uH, Cf ranges (0-15 pf), Cm ranges (0-15 pf), RF balun (inductor=20 nH to 2 uH, capacitor=0-15 pf).

In some embodiments, the transmit/receive RF coil array 10A or a transmit or transmit/shim coil array can also be used to carry out $B_1$ shimming.

It is contemplated that, in some embodiments, a very large Transmit/Receive (T/R) body coil (e.g., 60 cm inside diameter (I.D.) for the body coil in GE 3 T MR750), and a smaller size receive-only RF array with the split DC loops 10s (e.g., a head array I.D. 25 cm for human brain imaging) can be used as cooperating arrays. In this cooperating case, the T/R Body coil can be configured to only perform RE Transmit and may not include (can be devoid of) the DC mode or DC loops $10_{DC}$. The receive-only array can reside inside the T/R body coil and can be configured to only perform RF Reception. The receive-only array can be widely used for the head, chest, breast, heart, musculoskeletal imaging, and so on. The DC loops $10_{DC}$ allowing for Bo shimming can be only integrated into the RF-receive only array.

In some embodiments, the DC mode to activate the DC loops $10_{DC}$ of respective coil elements 10 can be operated in both a transmit and receive mode for each of the transmit and receive arrays if needed for $B_0$ shimming (e.g., even if the RF transmit or receive is inactive or switched off).

FIG. 11A is a schematic illustration of an MRI system 175 with a magnet M with the RF coil array 10A positioned therein, an MR scanner 75, at least one DC power supply 30 (shown as a plurality of DC power supplies $30_1$, $30_2$ for each respective RE element 10), a transmit/receive switch 60, receiver 62, and transmitter 64.

Figure 11B:
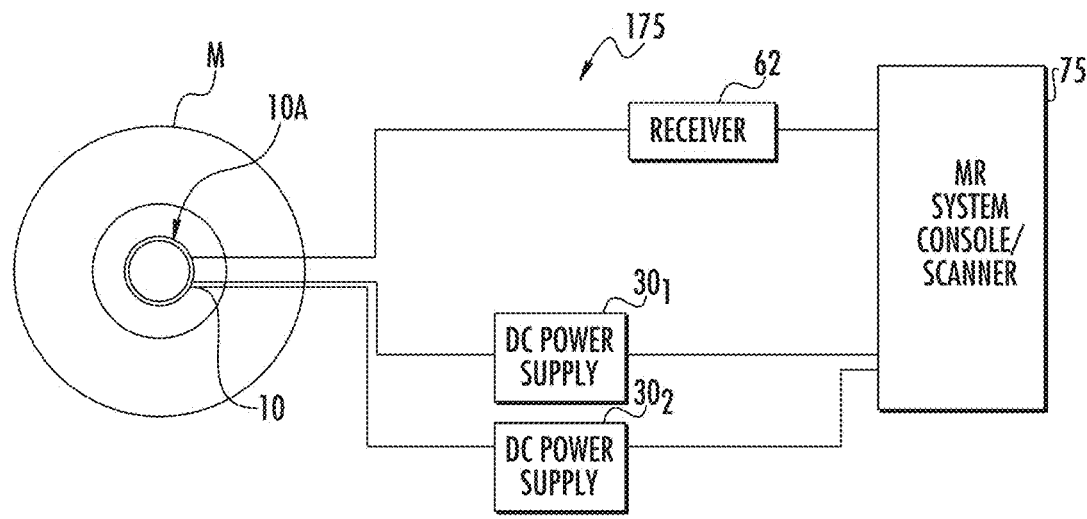
FIG. 11B is a schematic illustration of an MR Imaging system (e.g., MR Scanner) according to embodiments of the present invention.

FIG. 11B is a schematic illustration of an MRI system 175, similar to FIG. 11A, but without requiring a T/R switch or transmit circuit, which may be particularly suitable for an embodiments having an RF receive-only array 10A integrated with $B_0$ shimming.

Figure 12:
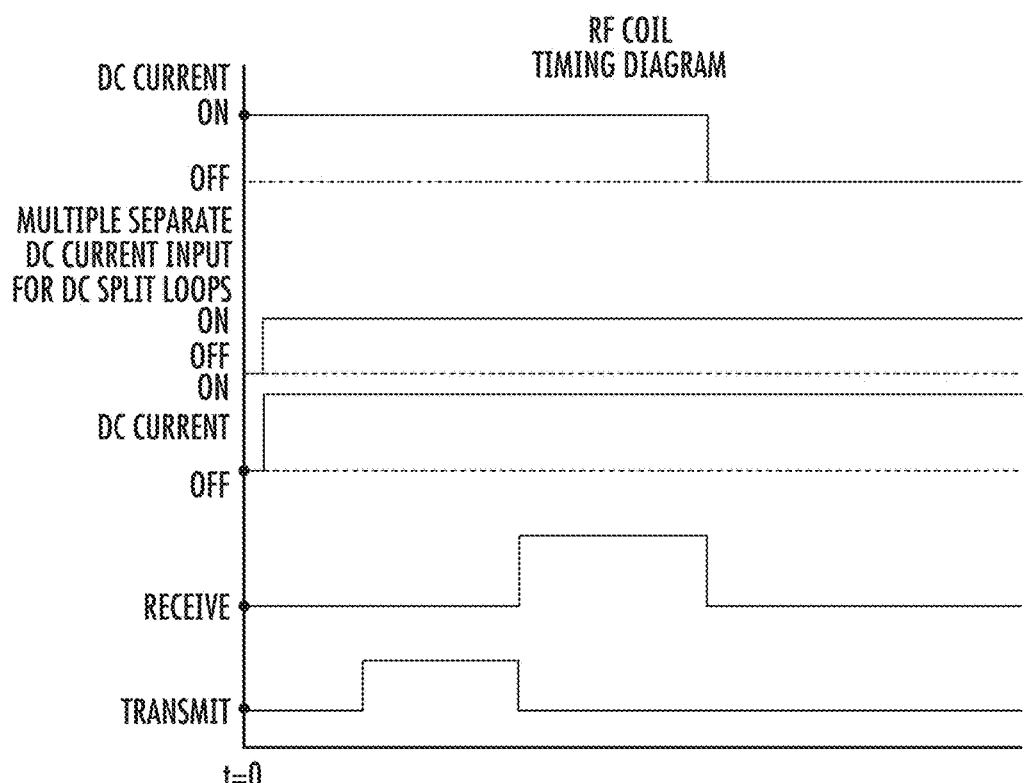
FIG. 12 is an example of a timing diagram according to embodiments of the present invention.

FIG. 12 is an exemplary timing diagram showing that the DC mode with separately adjustable current for respective DC loops of RF coil elements with split loops 10s can be longer than either the transmit or receive RF modes and can be continuous (second line) or discontinuous (upper line).

FIG. 13A is a schematic of an MRI system 175 similar to that shown in FIG. 11A/11B (omitting certain components for ease of discussion) illustrating that the DC power supply 30 (shown as a plurality of power supplies $30_1$, $30_2$ for each or a selected plurality of respective RF elements 10 for an RF coil or RF coil array 10A) can be electronically automatically adjusted to provide individually controllable amounts of current to respective split DC loops 10s of coil elements 10 to carry out automated shimming using local $B_0$ fields. The shimming with the current adjustment can be carried out using a control circuit partially or totally onboard the MR Scanner 75 or a separate controller 90 with a local $B_0$ RF coil shim and current control module 92 that communicates with the MR Scanner console 75c.

Figure 13B:
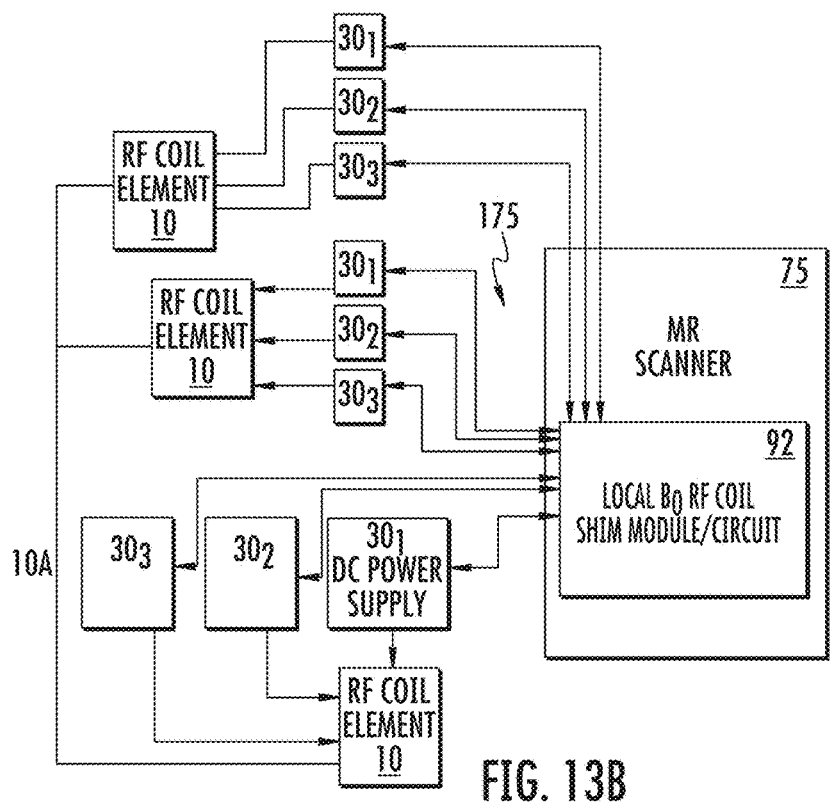
FIG. 13B is a schematic illustration of a circuit/module onboard the MR Scanner (console) according to embodiments of the present invention.

FIG. 13B illustrates that the MR Scanner 75 includes the local $B_0$ RF coil shim and current control module 92 for controlling DC power supplied/DC current to RF coil elements 10 (shown as $30_1$-$30_3$ different power supplies for a respective plurality of RF coil elements 10 of an RF coil array 10A). One or more than 3 power supplies or DC current input per RF coil element can be used.

Figure 13C:
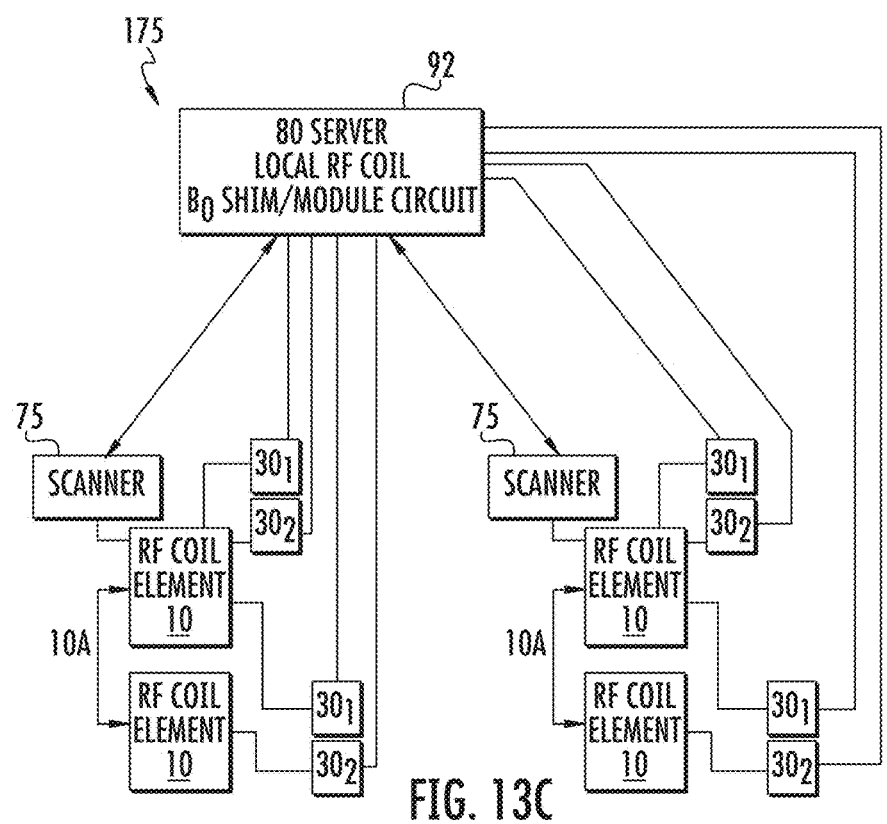
FIG. 13C is a schematic illustration of a circuit/module held at least partially on a server according to embodiments of the present invention.

FIG. 13C illustrates that at least one server 80 can communicate with one or more Scanners 75 and can include all or a portion of the local $B_0$ RF coil shim and current control module 92 which can control various DC power supplies 30 (shown as $30_1$-$30_3$ for a plurality of RF coil elements 10 of an RF coil array 10A). One or more than 3 power supplies or DC current input per RF coil element can be used. The at least one server 80 can be provided using cloud computing which includes the provision of computational resources on demand via a computer network. The resources can be embodied as various infrastructure services (e.g., compute, storage, etc.) as well as applications, databases, file services, email, etc. In the traditional model of computing, both data and software are typically fully contained on the user's computer; in cloud computing, the user's computer may contain little software or data (perhaps an operating system and/or web browser), and may serve as little more than a display terminal for processes occurring on a network of external computers. A cloud computing service (or an aggregation of multiple cloud resources) may be generally referred to as the "Cloud". Cloud storage may include a model of networked computer data storage where data is stored on multiple virtual servers, rather than being hosted on one or more dedicated servers.

In some embodiments, a single array 10A with multiple coil elements 10 (with each coil element 10 capable of carrying out transmit, receive and shimming functions) can provide the best results for both $B_0$ and $B_1$ shimming.

It is contemplated that $B_0$ shimming can be optimized based on the type, shape, geometry, and location of each coil element 10. Also, as noted above, the (shimming) circuits can be configured to individually adjust amplitude and timing of DC current in each RF coil element, typically in each split DC loop of each RF coil element. See, e.g., Vaughan et al. 9.4 T human MRI: preliminary results, Magn Reson Med 2006; 56:1274-1282; and Setsompop et al., Parallel RF transmission with eight channels at 3 Tesla. Magn Reson Med 2006; 56:1163-1171, the contents of which are hereby incorporated by reference as if recited in full herein.

If available, the spherical harmonic (SH) shim coils in the original MRI scanner 75 can further be used to complement the local $B_0$ shimming. To achieve an effective $B_1$ shimming, the same kinds of coil characteristics in each coil 10 can also be independently adjusted. It is contemplated that engineering design involving both DC and RF aspects of the coil array 10A can be integrated together to optimize the $B_0$ and $B_1$ fields, and can be widely applicable to a variety of coil shapes and geometries designed for different applications. These coil shapes and geometries include those for imaging the brain, for cardiac imaging, and musculoskeletal and other biological and physiological systems. See, e.g., Wiggins et al., 32-channel 3 Tesla receive-only phased-array head coil with soccer-ball element geometry. Magn Reson Med 2006; 56:216-223; Gräßl et al., Design, evaluation and application of a modular 32 channel transmit/receive surface coil array for cardiac MRI at 7 T, In: Proceedings of the ISMRM 20th Annual Meeting, Melbourne, 2012. p 305; and Kraff et al., An eight-channel transmit/receive multipurpose coil for musculoskeletal MR imaging at 7 T. Med Phys 2010; 37:6368-6376, the contents of which are hereby incorporated by reference as if recited in full herein.

The RF coil arrays 10A can be used with other RF coils. For example, a head coil with the RF coil array 10A can be used with conventional whole body coils or chest coils.

Figure 14:
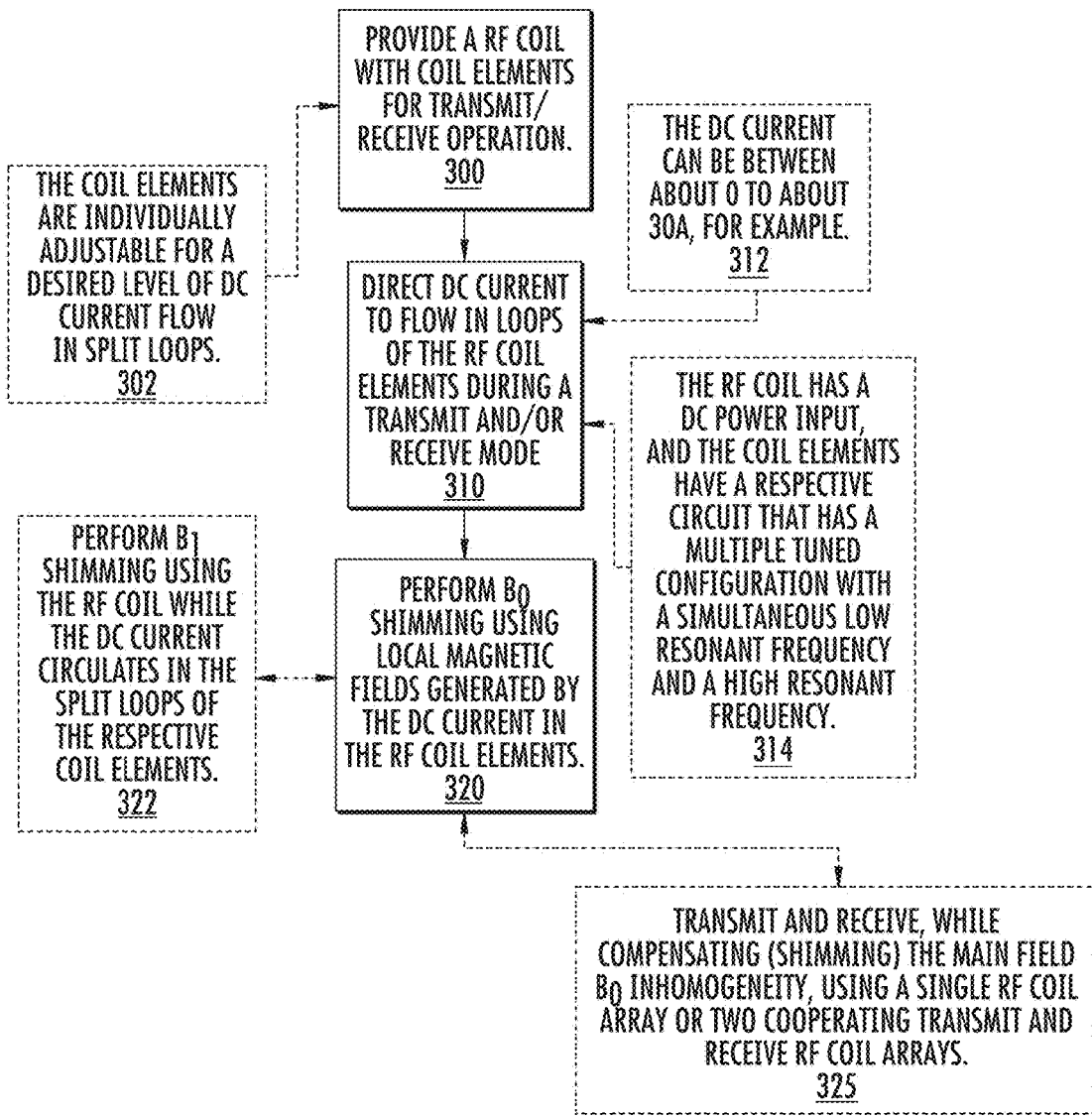
FIG. 14 is a flow diagram of exemplary steps that can be used to shim a magnet according to embodiments of the present invention.

In some embodiments, methods of $B_0$ shimming can be carried out as shown by the exemplary steps in FIG. 14. An RF coil with a plurality of coil elements can be provided. Each coil element can have a DC current path with split DC loops, the RF coil configured to operate in at least one of an RF transmit or receive RF mode (block 300). DC current is circulated in the DC current path during a transmit and/or receive operation of the RF coil (block 310). $B_0$ shimming is performed using local $B_0$ magnetic fields generated by the DC current in the loops of the RE coil elements (block 320).

RE current can flow through the coil elements or TEM elements while the DC current flows in the DC current loops of the coil elements simultaneously and independently without electromagnetic interference between the DC current and the RF current.

Each coil element can be individually adjusted to have a desired level of DC current flow (block 302). The DC current in respective coil elements can be between about 0 to about 30 amps "A" (block 312). The upper DC current level can be above 30 A as discussed above, the range 0-30 A is only an exemplary range.

The RF coil elements can have a DC power input and the DC current path that has a multiple (at least a dual) tuned configuration with a simultaneous low resonant frequency and a high resonant frequency (block 314). Thus, the elements can have a multi-tuned with more than 2 frequencies.

The method can include $B_1$ shimming, while $B_0$ shimming, using the generated local $B_1$ magnetic fields from the coil elements of the RF coil (block 322).

The method can include transmitting and receiving RF signal independently and simultaneously while compensating (shimming) the main field $B_0$ inhomogeneity using the RF coil. The RF coil can be a single transmit and receive RF coil array or can be a cooperating pair of separate receive and transmit RF coil arrays (block 325).

Embodiments of the present invention may take the form of an entirely software embodiment or an embodiment combining software and hardware aspects, all generally referred to herein as a "circuit" or "module." Furthermore, the present invention may take the form of a computer program product on a computer-usable storage medium having computer-usable program code embodied in the medium. Any suitable computer readable medium may be utilized including hard disks, CD-ROMs, optical storage devices, a transmission media such as those supporting the Internet or an intranet, or magnetic storage devices. Some circuits, modules or routines may be written in assembly language or even micro-code to enhance performance and/or memory usage. It will be further appreciated that the functionality of any or all of the program modules may also be implemented using discrete hardware components, one or more application specific integrated circuits (ASICs), or a programmed digital signal processor or microcontroller. Embodiments of the present invention are not limited to a particular programming language.

Computer program code for carrying out operations of the present invention may be written in an object oriented programming language such as Java®, Smalltalk or C++. However, the computer program code for carrying out operations of the present invention may also be written in conventional procedural programming languages, such as the "C" programming language. The program code may execute entirely on an MR Scanner computer/processor(s), partly on the MR Scanner computer/processor(s), as a stand-alone software package, partly on the MR Scanner computer/processor(s) and partly on another computer, local and/or remote or entirely on the other local or remote computer (e.g., via a server). In the latter scenario, the other local or remote computer may be connected to the MR Scanner computer through a local area network (LAN) or a wide area network (WAN), or the connection may be made to an external computer (for example, through the Internet using an Internet Service Provider).

Embodiments of the present invention are described herein, in part, with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable memory that can direct a computer or other programmable data processing apparatus to function in a particular manner, such that the instructions stored in the computer-readable memory produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing some or all of the functions/acts specified in the flowchart and/or block diagram block or blocks.

The flowcharts and block diagrams of certain of the figures herein illustrate exemplary architecture, functionality, and operation of possible implementations of embodiments of the present invention. In this regard, each block in the flow charts or block diagrams represents a module, segment, or portion of code, which comprises one or more executable instructions for implementing the specified logical function(s). It should also be noted that in some alternative implementations, the functions noted in the blocks may occur out of the order noted in the figures. For example, two blocks shown in succession may in fact be executed substantially concurrently or the blocks may sometimes be executed in the reverse order or two or more blocks may be combined, or a block divided and performed separately, depending upon the functionality involved.

Figure 15:
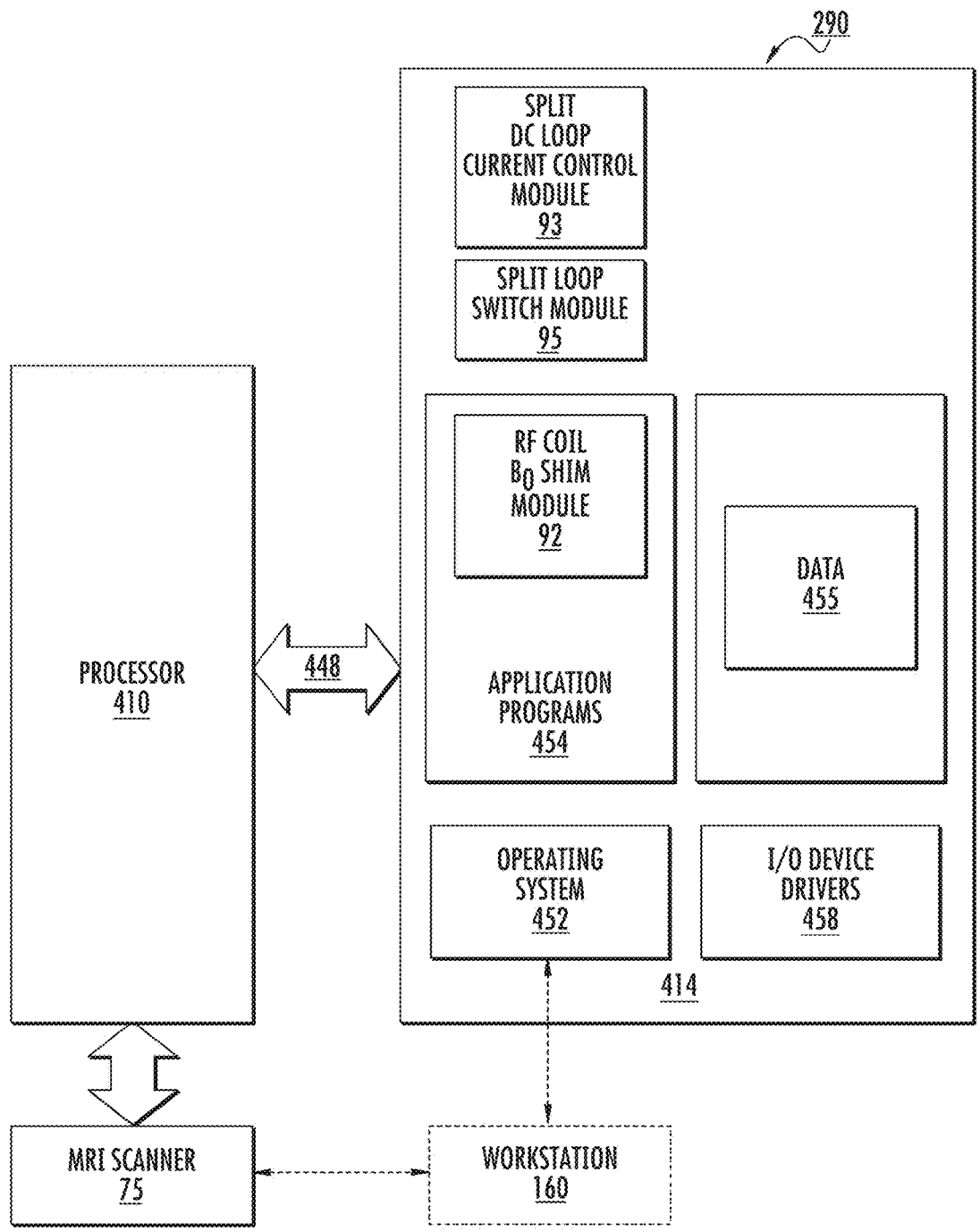
FIG. 15 is a block diagram of an exemplary data processing system according to embodiments of the present invention.

FIG. 15 is a schematic illustration of a circuit or data processing system 290. The system 290 can be used with any MR Scanner systems 175 and provide all or part of the circuit/module 92. The circuits and/or data processing systems 290 data processing systems may be incorporated in a digital signal processor in any suitable device or devices. As shown in FIG. 15, the processor 410 can communicate with (or be partially or totally onboard) an MRI scanner 75 and with memory 414 via an address/data bus 448. The processor 410 can be any commercially available or custom microprocessor. The memory 414 is representative of the overall hierarchy of memory devices containing the software and data used to implement the functionality of the data processing system. The memory 414 can include, but is not limited to, the following types of devices: cache, ROM, PROM, EPROM, EEPROM, flash memory, SRAM, and DRAM.

FIG. 15 illustrates that the memory 414 may include several categories of software and data used in the data processing system: the operating system 452; the application programs 454; the input/output (I/O) device drivers 458; and data 455. The data 455 can include magnet inhomogeneity data and desired local $B_0$ magnetic field compensation using split (static or switchable) DC current loops 10s of an RF coil array 10A. FIG. 15 also illustrates that the application programs 454 can include an RF Coil Array Local $B_0$ magnetic field shim Module 92, a separate DC loop current adjustment control Module for split DC loops of respective RF coil elements 93 and an optional split loop switch control Module 95 to change a respective RF coil element into having different numbers of split DC loops.

As will be appreciated by those of skill in the art, the operating systems 452 may be any operating system suitable for use with a data processing system, such as OS/2, AIX, DOS, OS/390 or System390 from International Business Machines Corporation, Armonk, NY, Windows CE, Windows NT, Windows95, Windows98, Windows2000, windowsxp or other Windows versions from Microsoft Corporation, Redmond, WA, Unix or Linux or freebsd, Palm OS from Palm, Inc., Mac OS from Apple Computer, labview, or proprietary operating systems. The I/O device drivers 458 typically include software routines accessed through the operating system 452 by the application programs 454 to communicate with devices such as I/O data port(s), data storage 455 and certain memory 414 components. The application programs 454 are illustrative of the programs that implement the various features of the data (image) processing system and can include at least one application, which supports operations according to embodiments of the present invention. Finally, the data 455 represents the static and dynamic data used by the application programs 454, the operating system 452, the I/O device drivers 458, and other software programs that may reside in the memory 414.

While the present invention is illustrated, for example, with reference to the Modules 92, 93, 95 being an application program in FIG. 15, as will be appreciated by those of skill in the art, other configurations may also be utilized while still benefiting from the teachings of the present invention. For example, the Module 92 may also be incorporated into the operating system 452, the I/O device drivers 458 or other such logical division of the data processing system. Thus, the present invention should not be construed as limited to the configuration of FIG. 15 which is intended to encompass any configuration capable of carrying out the operations described herein. Further, Modules 92, 93 and 95 can communicate with or be incorporated totally or partially in other components, such as an MRI scanner 75, an interface/gateway or workstation.

The I/O data port can be used to transfer information between the data processing system, a workstation, the MRI scanner 75, the interface/gateway and another computer system or a network (e.g., the Internet) or to other devices or circuits controlled by the processor. These components may be conventional components such as those used in many conventional data processing systems, which may be configured in accordance with the present invention to operate as described herein.

Figure 16A:
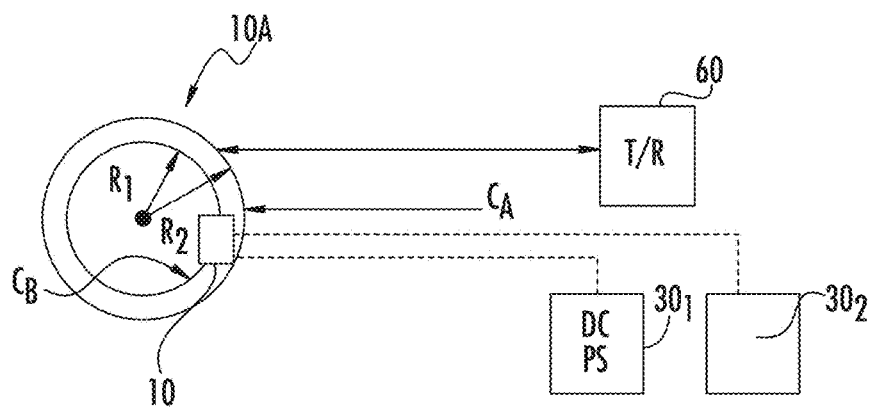
FIGS. 16A and 16B are schematic illustrations of cooperating RF coil arrays according to embodiments of the present invention.
Figure 16B:
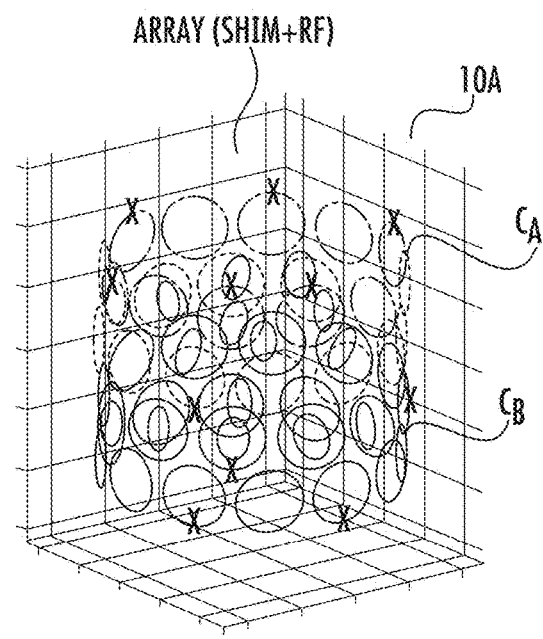

It is contemplated that, in some embodiments, a very large Transmit/Receive (T/R) body coil (e.g., 60 cm inside diameter (I.D.) for the body coil in GE 3 T MR750), and a smaller size receive-only RF array with the split DC loops $10_{DC}$ (e.g., a head array I.D. 25 cm for human brain imaging) can be used as cooperating arrays $C_A$, $C_B$ as schematically shown in FIGS. 16A and 16B. In this cooperating embodiment, the T/R Body coil $C_A$ can be configured to only perform RF Transmit and may not include (can be devoid of) the DC mode or split DC loops $10_{DC}$. Respective coil elements 10 can be in communication with one or a plurality of DC power supplies (shown as two by way of example in FIG. 16A). The receive-only array $C_B$ can reside inside the T/R body coil and can be configured to only perform RF Reception. The receive-only array can be widely used for the head, chest, breast, heart, musculoskeletal imaging, and so on. The DC loops $10_{DC}$ allowing for Bo shimming can be only integrated into the RF-receive only array $C_B$.

In some embodiments, the DC mode to activate the DC loops $10_{DC}$ of respective coil elements 10 can be operated in both a transmit and receive mode for each of the transmit and receive arrays $C_A$, $C_B$ if needed for $B_0$ shimming (e.g., even if the RF transmit or receive is inactive or switched off).

In some embodiments, a single iPRES coil array can perform parallel RF transmission (with $B_1$ shimming), parallel reception, and $B_0$ shimming altogether. The iPRES technology can indeed be achieved within one coil or one coil array of any size, shape and geometry. Further, iPRES RF coil arrays can be implemented in a flexible manner by any DC split loop combinations to meet practical considerations (e.g. by using separate transmit and receive coil arrays one or both having $B_0$ shim circuits).

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. In the claims, means-plus-function clauses are intended to cover the structures described herein as performing the recited function and not only structural equivalents but also equivalent structures. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

That which is claimed:

1. A Magnetic Resonance Imaging (MRI) system, comprising:
    an RF coil array with a plurality of coil elements, wherein at least one of the plurality of coil elements in the RF coil array defines a split direct current (DC) loop, the defined split DC loop including at least two separate DC loop paths, with each of the at least two separate DC loop paths individually and independently circulating DC current, and wherein the RF coil array is configured to be simultaneously operative in both (i) an RF mode that performs at least one of transmit or receive and (ii) a DC mode with DC current flowing in each of the at least two separate DC loop paths of the defined split DC loop in order to generate local $B_0$ magnetic fields that the MRI system uses to perform $B_0$ shimming;
    at least one DC power supply coupled to the RF coil array in order to supply DC current into each of the at least two separate DC loop paths of the defined split DC loop in the RF coil array; and
    a control circuit coupled with the RF coil array and configured to direct the at least one DC power supply in order to provide the DC current into each of the at least two separate DC loop paths of the defined split DC loop that are generating the local $B_0$ magnetic fields, wherein the control circuit is configured to independently adjust amplitude and polarity of the provided DC current for each of the at least two separate DC loop paths of the defined split DC loop of the RF coil array that is being powered by the at least one DC power supply.

2. The system of claim 1, wherein at least one switch is coupled to the control circuit and a conductor of the defined split DC loop in order to sub-divide the defined split DC loop into smaller DC loop paths, wherein the control circuit is configured to selectively activate the at least one switch of the defined split DC loop thereby generating the local $B_0$ magnetic fields that the MRI system uses to perform $B_0$ shimming.

3. The system of claim 2, wherein the at least one switch is configured to be selectively activated in order to increase or decrease a number of the at least two separate DC loop paths circulating DC current in the defined split DC loop in the RF coil array.

4. The system of claim 2, wherein the at least one DC power supply comprises
    a first power supply and a second power supply, the first power supply being coupled to a first one of the at least two separate DC loop paths and
    the second power supply being coupled to a second one of the at least two separate DC loop paths of the defined split DC loop in the RF coil array, and
    wherein the control circuit is coupled to and controls the first and second power supplies in order to independently adjust the amplitude and polarity of the provided DC current.

5. The system of claim 4, wherein the defined split DC loop includes an RF conductor that defines an RF path, and wherein the defined split DC loop with the at least two separate DC loop paths comprises
    a plurality of spaced apart capacitors electrically connected to the RF conductor, at least one of the spaced apart capacitors residing between terminal inputs of the first power supply in the first one of the at least two separate DC loop paths and at least one other spaced apart capacitor residing between terminal inputs of the second power supply in the second one of the at least two separate DC loop paths.

6. The system of claim 4, wherein the defined split DC loop comprises at least one first inductor that resides in a current path between the first power supply and the first one of the at least two separate DC loop paths and at least one second inductor that resides in a different current path between the second power supply and the second one of the at least two separate DC loop paths.

7. The system of claim 1, wherein the plurality of coil elements of the RF coil array each include a conductor defining an RF path, wherein the defined split DC loop comprises at least two separate inductors in each of the at least two separate DC loop paths, with at least one inductor being associated with a respective at least one parallel inductor capacitor (LC) resonant circuit having a high resonant frequency.

8. The system of claim 1, wherein the defined split DC loop includes an RF conductor defining an RF path with a perimeter, wherein each of the at least two separate DC loop paths includes conductor segments of the RF conductor and has a perimeter that is smaller than the perimeter of the RF conductor, and wherein at least part of the perimeter of each of the at least two separate DC loop paths is are located inside a boundary of the perimeter of the RF conductor and does not form part of the RF path.

9. The system of claim 1, wherein the at least two separate DC loop paths comprise a number between 2-12 separate DC loop paths and none of the 2-12 DC loop paths form a complete RF path with a respective defined split DC loop.

10. The system of claim 1, wherein the RF coil array is (i) a receive-only RF coil array, (ii) a transmit-only RF coil array, or (iii) a transmit and receive RF coil array, and wherein the defined split DC loop comprises spaced apart inductors of parallel inductor capacitor (LC) resonant circuits that have a high resonant frequency, and wherein when DC current flows through the inductors of the parallel LC resonant circuits, RF signal travels across a corresponding capacitor of the parallel LC resonant circuits.

11. The system of claim 1, wherein the RF coil array is configured as a cooperating set of a transmit only and a receive only RF coil array, and wherein, only the receive only RF coil array has the at least one coil element of the RF coil array with the defined split DC loop that generates the local $B_0$ magnetic fields.

12. The system of claim 1, wherein the defined split DC loop functions as a multiple-tuned RF circuit with concurrent high and low resonant frequencies.

13. The system of claim 1, wherein the control circuit is in communication with an MR Scanner or is located at least partially or totally onboard the MR Scanner of the MRI system, and
wherein the at least two DC loop paths of the defined split DC loop each include at least one inductor forming at least one parallel inductor capacitor (LC) resonant circuit with a resonant frequency corresponding to an operating frequency of the MR Scanner.

14. The system of claim 13, wherein, in operation, DC current flows through the inductor of the parallel LC resonant circuit of each of the at least two separate DC loop paths while RF current flows across a capacitor of the parallel LC resonant circuit.

15. The system of claim 1, further comprising:
an MR Scanner of the MRI system in communication with the RF coil array; and
a transmit/receive switch in communication with both the MR Scanner and the RF coil array.

16. The system of claim 1, wherein the control circuit is in communication with an MR Scanner of the MRI system or is located at least partially or totally onboard an MR Scanner of the MRI system.

17. The system of claim 1, wherein the control circuit is configured to cooperate with the MRI system when generating $B_0$ maps associated with the locally generated $B_0$ magnetic fields and also cooperate with the MRI system in order to perform the $B_0$ shimming using the locally generated $B_0$ magnetic fields as the source of the $B_0$ shimming without electromagnetic interference between the DC current and RF current.

18. The system of claim 1, wherein the RF coil array is configured to generate the local $B_0$ magnetic fields that are used by the MRI system and provide a uniform magnetic field across biological tissue or target material.

19. A computer program product usable with an MRI system comprising a non-transitory computer readable medium having encoded thereon instructions that, when executed by a processor, cause the processor to:
control multiple operations of an MRI RF coil array with multiple coil elements, wherein one or more of the multiple coil elements being controlled comprises a defined split direct current (DC) loop with two or more separate DC loop paths, whereby the two or more separate DC loop paths independently and individually circulate DC current, and wherein the defined split DC loop is simultaneously operative in both (i) an RF mode that performs at least one of RF transmit or RF receive and (ii) a DC mode in which DC current flows within the two or more separate DC loop paths of the defined split DC loop in order to generate local $B_0$ magnetic fields as a source of $B_0$ shimming in an MRI system; and
control DC current amplitude and/or polarity being provided to each of the two or more separate DC loop paths by allowing independent adjustment of current amplitude and/or polarity in each of the two or more separate DC loop paths.

20. A method of shimming Magnetic Resonance (MR) systems, comprising:
providing the MR system with at least one RF coil or RF coil array comprising:
a plurality of coil elements, wherein the RF coil or the RF coil array defines a split direct current (DC) loop, wherein the defined split DC loop comprises at least two separate DC loop paths;
operating the at least one RF coil, or RF coil array, in at least one of an RF transmit or RF receive mode;
circulating DC current through the at least two separate DC current loop paths in the defined split DC loop during operation of at least one of the RF transmit or RF receive mode;
independently and electronically adjusting amplitude and/or polarity of the circulating DC current in each of the at least two separate DC loop paths of the defined split DC loop by controlling an input of current from at least one DC power supply along different current input paths into each of the at least two separate DC loop paths;
generating local $B_0$ magnetic fields with the MR system in response to the circulating DC current in the at least two separate DC loop paths; and
performing a $B_0$ shimming of an imaging space of a magnet of the MR system by using the generated local $B_0$ magnetic fields that occur during the operation of the at least one RF transmit or RF receive mode in order to acquire MR image data.

21. The method of claim 20, wherein the operating of the at least one RF coil or RF coil array is carried out in order to operate an RF transmit mode, when RF current is concurrently flowing through the RF coil or the RF coil array in order to transmit an RF excitation pulse during the RF transmit mode while the DC current circulates simultaneously and independently in the at least two separate DC loop paths without electromagnetic interference between the DC current and the RF current.

22. The method of claim 20, further comprising generating RF $B_1$ magnetic fields by using the plurality of coil elements in order to adjust an amplitude, phase, timing, and frequency of the RF being transmitted in the plurality of coil elements as a source of RF $B_1$ magnetic fields that is being used in a $B_1$ shimming procedure.

23. The method of claim 20, wherein the at least one RF coil or RF coil array has between 2-12 separate DC loop paths for the defined split DC loop.

24. The method of claim 20, wherein the RF coil or the plurality of coil elements of the RF coil array include an RF conductor defining an RF path with a perimeter, wherein the at least two separate DC loop paths of the defined split DC loop include conductor segments of the perimeter of the RF conductor, wherein the at least two DC loop paths have a perimeter that is smaller than the perimeter of the RF conductor and are partly located inside a boundary of the perimeter of the RF conductor and do not form part of the RF path.

25. The method of claim 20, wherein the at least two separate DC loop paths of the defined split DC loop comprise first and second separate inductors, each of the first and second inductors associated with a respective at least one parallel inductor capacitor (LC) resonant circuit with a resonant frequency of the MR system, and wherein, in operation, DC current flows through the first inductor in a first one of the at least two separate DC loop paths and DC current flows independently through the second inductor in a second one of the at least two separate DC loop paths, and wherein the at least two separate DC loop paths are provided as a number between 2-12.

* * * * *

UNITED STATES PATENT AND TRADEMARK OFFICE
CERTIFICATE OF CORRECTION

PATENT NO. : 9,880,242 B2  
APPLICATION NO. : 14/881767  
DATED : January 30, 2018  
INVENTOR(S) : Darnell et al.

Page 1 of 1

It is certified that error appears in the above-identified patent and that said Letters Patent is hereby corrected as shown below:

In the Specification

Column 13, Line 1: Please correct "C1" to read -- $C_1$ --

Column 13, Line 4: Please correct "C1" to read -- $C_1$ --

Column 15, Line 28: Please correct "$M_{DC}$" to read -- $10_{DC}$ --

Column 15, Line 50: Please correct "RE" to read -- RF --

Column 16, Line 50: Please correct "19B" to read -- 9B --

In the Claims

Column 26, Claim 8, Line 65: Please correct "is are located" to read -- is located --

Signed and Sealed this  
Twenty-second Day of May, 2018

Andrei Iancu  
*Director of the United States Patent and Trademark Office*